(12) United States Patent
Marchais et al.

(10) Patent No.: US 12,276,687 B2
(45) Date of Patent: Apr. 15, 2025

(54) METHODS AND SYSTEMS FOR ESTIMATING COIL IMPEDANCE OF AN ELECTROMAGNETIC TRANSDUCER

(71) Applicant: Cirrus Logic International Semiconductor Ltd., Edinburgh (GB)

(72) Inventors: Emmanuel Marchais, Dripping Springs, TX (US); Jon Hendrix, Wimberley, TX (US)

(73) Assignee: Cirrus Logic Inc., Austin, TX (US)

( * ) Notice: Subject to any disclaimer, the term of this patent is extended or adjusted under 35 U.S.C. 154(b) by 597 days.

(21) Appl. No.: 16/870,401

(22) Filed: May 8, 2020

(65) Prior Publication Data

US 2021/0174777 A1 Jun. 10, 2021

Related U.S. Application Data

(60) Provisional application No. 62/944,090, filed on Dec. 5, 2019.

(51) Int. Cl.
*G01R 27/26* (2006.01)
*G01L 1/16* (2006.01)

(52) U.S. Cl.
CPC ............ *G01R 27/2611* (2013.01); *G01L 1/16* (2013.01)

(58) Field of Classification Search
CPC .. G01R 27/2611; G01R 27/26; G01R 17/105; G01R 31/389; G01R 27/00; G01R 27/02; G01R 15/20; G01R 27/08; G01R 31/2829; G01R 31/28; G01L 1/16; G01L 1/18; G01L 1/14; G01L 1/183; G05B 2219/40553; G05D 1/005; H01H 2003/008; H03G 3/005; H03G 7/008; H03G 3/3005; G01N 27/028; B06B 1/045; B06B 1/00; B06B 1/0207; B06B 1/0215; B06B 1/0276; G06F 3/016; G06F 3/01; G08B 6/00; G01H 13/00; G10K 9/13; H02N 2/06; H03F 3/50; H03F 1/08; H03F 2200/03; H03F 2200/471;
(Continued)

(56) References Cited

U.S. PATENT DOCUMENTS 3,686,927 A 8/1972 Scharton
4,902,136 A 2/1990 Mueller et al.
(Continued)

FOREIGN PATENT DOCUMENTS

AU 2002347829 4/2003
CN 103165328 A 6/2013
(Continued)

OTHER PUBLICATIONS

Examination Report under Section 18(3), United Kingdom Intellectual Property Office, Application No. GB2018050.1, mailed Dec. 22, 2021.
(Continued)

*Primary Examiner* — Daniel R Miller
*Assistant Examiner* — Eric Sebastian Von Wald
(74) *Attorney, Agent, or Firm* — Jackson Walker L.L.P.

(57) ABSTRACT

A method may include selecting, based on a condition of an electromagnetic load, a selected measurement technique from a plurality of impedance measurement techniques for measuring an impedance of the electromagnetic load and performing the selected measurement technique to generate an estimate of the impedance of the electromagnetic load.

43 Claims, 11 Drawing Sheets

(58) Field of Classification Search
CPC ..... H03F 3/181; H03F 3/2175; H04R 29/003; H04R 9/06; H04R 2400/03; H04R 3/00; H04R 9/025; H04R 29/001
See application file for complete search history.

(56) References Cited

U.S. PATENT DOCUMENTS

| | | | |
|---|---|---|---|
| 5,374,896 | A | 12/1994 | Sato et al. |
| 5,684,722 | A | 11/1997 | Thorner et al. |
| 5,748,578 | A | 5/1998 | Schell |
| 5,857,986 | A | 1/1999 | Moriyasu |
| 6,050,393 | A | 4/2000 | Murai et al. |
| 6,278,790 | B1 | 8/2001 | Davis et al. |
| 6,294,891 | B1 | 9/2001 | McConnell et al. |
| 6,332,029 | B1 | 12/2001 | Azima et al. |
| 6,388,520 | B2 | 5/2002 | Wada et al. |
| 6,567,478 | B2 | 5/2003 | Oishi et al. |
| 6,580,796 | B1 | 6/2003 | Kuroki |
| 6,683,437 | B2 | 1/2004 | Tierling |
| 6,703,550 | B2 | 3/2004 | Chu |
| 6,762,745 | B1 | 7/2004 | Braun et al. |
| 6,768,779 | B1 | 7/2004 | Nielsen |
| 6,784,740 | B1 | 8/2004 | Tabatabaei |
| 6,816,833 | B1 | 11/2004 | Iwamoto et al. |
| 6,906,697 | B2 | 6/2005 | Rosenberg |
| 6,995,747 | B2 | 2/2006 | Casebolt et al. |
| 7,042,286 | B2 | 5/2006 | Meade et al. |
| 7,154,470 | B2 | 12/2006 | Tierling |
| 7,277,678 | B2 | 10/2007 | Rozenblit et al. |
| 7,301,094 | B1 | 11/2007 | Noro et al. |
| 7,333,604 | B2 | 2/2008 | Zernovizky et al. |
| 7,392,066 | B2 | 6/2008 | Hapamas |
| 7,456,688 | B2 | 11/2008 | Okazaki et al. |
| 7,623,114 | B2 | 11/2009 | Rank |
| 7,639,232 | B2 | 12/2009 | Grant et al. |
| 7,777,566 | B1 | 8/2010 | Drogi et al. |
| 7,791,588 | B2 | 9/2010 | Tierling et al. |
| 7,825,838 | B1 | 11/2010 | Srinivas et al. |
| 7,979,146 | B2 | 7/2011 | Ullrich et al. |
| 8,068,025 | B2 | 11/2011 | Devenyi et al. |
| 8,098,234 | B2 | 1/2012 | Lacroix et al. |
| 8,102,364 | B2 | 1/2012 | Tierling |
| 8,325,144 | B1 | 12/2012 | Tierling et al. |
| 8,427,286 | B2 | 4/2013 | Grant et al. |
| 8,441,444 | B2 | 5/2013 | Moore et al. |
| 8,466,778 | B2 | 6/2013 | Wang et al. |
| 8,480,240 | B2 | 7/2013 | Kashiyama |
| 8,572,293 | B2 | 10/2013 | Cruz-Hernandez et al. |
| 8,572,296 | B2 | 10/2013 | Cruz-Hernandez et al. |
| 8,593,269 | B2 | 11/2013 | Grant et al. |
| 8,648,659 | B2 | 2/2014 | Oh et al. |
| 8,648,829 | B2 | 2/2014 | Shahoian et al. |
| 8,754,757 | B1 | 6/2014 | Ullrich et al. |
| 8,754,758 | B1 | 6/2014 | Ullrich et al. |
| 8,947,216 | B2 | 2/2015 | Da Costa et al. |
| 8,981,915 | B2 | 3/2015 | Birnbaum et al. |
| 8,994,518 | B2 | 3/2015 | Gregorio et al. |
| 9,019,087 | B2 | 4/2015 | Bakircioglu et al. |
| 9,030,428 | B2 | 5/2015 | Fleming |
| 9,063,570 | B2 | 6/2015 | Weddle et al. |
| 9,070,856 | B1 | 6/2015 | Rose et al. |
| 9,083,821 | B2 | 7/2015 | Hughes |
| 9,092,059 | B2 | 7/2015 | Bhatia |
| 9,117,347 | B2 | 8/2015 | Matthews |
| 9,128,523 | B2 | 9/2015 | Buuck et al. |
| 9,164,587 | B2 | 10/2015 | Da Costa et al. |
| 9,196,135 | B2 | 11/2015 | Shah et al. |
| 9,248,840 | B2 | 2/2016 | Truong |
| 9,326,066 | B2 | 4/2016 | Klippel |
| 9,329,721 | B1 | 5/2016 | Buuck et al. |
| 9,354,704 | B2 | 5/2016 | Lacroix et al. |
| 9,368,005 | B2 | 6/2016 | Cruz-Hernandez et al. |
| 9,489,047 | B2 | 11/2016 | Jiang et al. |
| 9,495,013 | B2 | 11/2016 | Underkoffler et al. |
| 9,507,423 | B2 | 11/2016 | Gandhi et al. |
| 9,513,709 | B2 | 12/2016 | Gregorio et al. |
| 9,520,036 | B1 | 12/2016 | Buuck |
| 9,588,586 | B2 | 3/2017 | Rihn |
| 9,640,047 | B2 | 5/2017 | Choi et al. |
| 9,652,041 | B2 | 5/2017 | Jiang et al. |
| 9,696,859 | B1 | 7/2017 | Heller et al. |
| 9,697,450 | B1 | 7/2017 | Lee |
| 9,715,300 | B2 | 7/2017 | Sinclair et al. |
| 9,740,381 | B1 | 8/2017 | Chaudhri et al. |
| 9,842,476 | B2 | 12/2017 | Rihn et al. |
| 9,864,567 | B2 | 1/2018 | Seo |
| 9,881,467 | B2 | 1/2018 | Levesque |
| 9,886,829 | B2 | 2/2018 | Levesque |
| 9,946,348 | B2 | 4/2018 | Ullrich et al. |
| 9,947,186 | B2 | 4/2018 | Macours |
| 9,959,744 | B2 | 5/2018 | Koskan et al. |
| 9,965,092 | B2 | 5/2018 | Smith |
| 9,990,089 | B2 | 6/2018 | Dickinson et al. |
| 10,032,550 | B1 | 7/2018 | Zhang et al. |
| 10,039,080 | B2 | 7/2018 | Miller et al. |
| 10,055,950 | B2 | 8/2018 | Saboune et al. |
| 10,074,246 | B2 | 9/2018 | Da Costa et al. |
| 10,082,873 | B2 | 9/2018 | Zhang |
| 10,102,722 | B2 | 10/2018 | Levesque et al. |
| 10,110,152 | B1 | 10/2018 | Hajati |
| 10,165,358 | B2 | 12/2018 | Koudar et al. |
| 10,171,008 | B2 | 1/2019 | Nishitani et al. |
| 10,175,763 | B2 | 1/2019 | Shah |
| 10,191,579 | B2 | 1/2019 | Forlines et al. |
| 10,264,348 | B1 | 4/2019 | Harris et al. |
| 10,402,031 | B2 | 9/2019 | Vandermeijden et al. |
| 10,447,217 | B2 | 10/2019 | Zhao et al. |
| 10,452,144 | B2 * | 10/2019 | Aimone ............... G06F 3/016 |
| 10,564,727 | B2 | 2/2020 | Billington et al. |
| 10,620,704 | B2 | 4/2020 | Rand et al. |
| 10,667,051 | B2 | 5/2020 | Stahl |
| 10,726,638 | B2 | 7/2020 | Mondello et al. |
| 10,732,714 | B2 | 8/2020 | Rao et al. |
| 10,735,956 | B2 | 8/2020 | Bae et al. |
| 10,782,785 | B2 | 9/2020 | Hu et al. |
| 10,795,443 | B2 | 10/2020 | Hu et al. |
| 10,820,100 | B2 | 10/2020 | Stahl et al. |
| 10,828,672 | B2 | 11/2020 | Stahl et al. |
| 10,832,537 | B2 | 11/2020 | Doy et al. |
| 10,841,696 | B2 * | 11/2020 | Mamou-Mani ........................... G10K 11/17854 |
| 10,848,886 | B2 | 11/2020 | Rand |
| 10,860,202 | B2 | 12/2020 | Sepehr et al. |
| 10,955,955 | B2 | 3/2021 | Peso Parada et al. |
| 10,969,871 | B2 | 4/2021 | Rand et al. |
| 10,976,825 | B2 | 4/2021 | Das et al. |
| 11,069,206 | B2 | 7/2021 | Rao et al. |
| 11,079,874 | B2 | 8/2021 | Lapointe et al. |
| 11,139,767 | B2 | 10/2021 | Janko et al. |
| 11,150,733 | B2 | 10/2021 | Das et al. |
| 11,259,121 | B2 | 2/2022 | Lindemann et al. |
| 11,460,526 | B1 | 10/2022 | Foo et al. |
| 11,500,469 | B2 | 11/2022 | Rao et al. |
| 11,669,165 | B2 | 6/2023 | Das et al. |
| 2001/0043714 | A1 | 11/2001 | Asada et al. |
| 2002/0018578 | A1 | 2/2002 | Burton |
| 2002/0044046 | A1 | 4/2002 | Takahashi |
| 2002/0085647 | A1 | 7/2002 | Oishi et al. |
| 2003/0068053 | A1 | 4/2003 | Chu |
| 2003/0214485 | A1 | 11/2003 | Roberts |
| 2004/0120540 | A1 | 6/2004 | Mullenborn et al. |
| 2005/0031140 | A1 | 2/2005 | Browning |
| 2005/0134562 | A1 | 6/2005 | Grant et al. |
| 2005/0195919 | A1 | 9/2005 | Cova |
| 2006/0028095 | A1 | 2/2006 | Maruyama et al. |
| 2006/0197753 | A1 | 9/2006 | Hotelling |
| 2006/0284856 | A1 | 12/2006 | Soss |
| 2007/0013337 | A1 | 1/2007 | Liu et al. |
| 2007/0024254 | A1 | 2/2007 | Radecker et al. |
| 2007/0241816 | A1 | 10/2007 | Okazaki et al. |
| 2008/0077367 | A1 | 3/2008 | Odajima |
| 2008/0167832 | A1 | 7/2008 | Soss |
| 2008/0226109 | A1 | 9/2008 | Yamakata et al. |
| 2008/0240458 | A1 | 10/2008 | Goldstein et al. |

(56) References Cited

U.S. PATENT DOCUMENTS

| | | |
|---|---|---|
| 2008/0293453 A1 | 11/2008 | Atlas et al. |
| 2008/0316181 A1 | 12/2008 | Nurmi |
| 2009/0020343 A1 | 1/2009 | Rothkopf et al. |
| 2009/0079690 A1 | 3/2009 | Watson et al. |
| 2009/0088220 A1 | 4/2009 | Persson |
| 2009/0096632 A1 | 4/2009 | Ullrich et al. |
| 2009/0102805 A1 | 4/2009 | Meijer et al. |
| 2009/0128306 A1 | 5/2009 | Luden et al. |
| 2009/0153499 A1 | 6/2009 | Kim et al. |
| 2009/0189867 A1 | 7/2009 | Krah et al. |
| 2009/0278819 A1 | 11/2009 | Goldenberg et al. |
| 2009/0313542 A1 | 12/2009 | Cruz-Hernandez et al. |
| 2010/0013761 A1 | 1/2010 | Birnbaum et al. |
| 2010/0080331 A1 | 4/2010 | Garudadri et al. |
| 2010/0085317 A1 | 4/2010 | Park et al. |
| 2010/0141408 A1 | 6/2010 | Doy et al. |
| 2010/0141606 A1 | 6/2010 | Bae et al. |
| 2010/0260371 A1 | 10/2010 | Afshar |
| 2010/0261526 A1 | 10/2010 | Anderson et al. |
| 2010/0331685 A1 | 12/2010 | Stein et al. |
| 2011/0056763 A1 | 3/2011 | Tanase et al. |
| 2011/0075835 A1 | 3/2011 | Hill |
| 2011/0077055 A1 | 3/2011 | Pakula et al. |
| 2011/0141052 A1 | 6/2011 | Bernstein et al. |
| 2011/0161537 A1 | 6/2011 | Chang |
| 2011/0163985 A1 | 7/2011 | Bae et al. |
| 2011/0167391 A1 | 7/2011 | Momeyer et al. |
| 2012/0011436 A1 | 1/2012 | Jinkinson et al. |
| 2012/0105358 A1 | 5/2012 | Momeyer et al. |
| 2012/0105367 A1 | 5/2012 | Son et al. |
| 2012/0112894 A1 | 5/2012 | Yang et al. |
| 2012/0206246 A1 | 8/2012 | Cruz-Hernandez et al. |
| 2012/0206247 A1 | 8/2012 | Bhatia et al. |
| 2012/0229264 A1 | 9/2012 | Company Bosch et al. |
| 2012/0249462 A1 | 10/2012 | Flanagan et al. |
| 2012/0253698 A1 | 10/2012 | Cokonaj |
| 2012/0306631 A1 | 12/2012 | Hughes |
| 2013/0016855 A1 | 1/2013 | Lee et al. |
| 2013/0027359 A1 | 1/2013 | Schevin et al. |
| 2013/0038792 A1 | 2/2013 | Quigley et al. |
| 2013/0096849 A1 | 4/2013 | Campbell et al. |
| 2013/0141382 A1 | 6/2013 | Simmons et al. |
| 2013/0208923 A1 | 8/2013 | Suvanto |
| 2013/0275058 A1 | 10/2013 | Awad |
| 2013/0289994 A1 | 10/2013 | Newman et al. |
| 2013/0307786 A1 | 11/2013 | Heubel |
| 2014/0035736 A1 | 2/2014 | Weddle et al. |
| 2014/0056461 A1 | 2/2014 | Afshar |
| 2014/0064503 A1* | 3/2014 | Ko .................... H04R 29/001 381/59 |
| 2014/0064516 A1 | 3/2014 | Cruz-Hernandez et al. |
| 2014/0079248 A1 | 3/2014 | Short et al. |
| 2014/0085064 A1 | 3/2014 | Crawley et al. |
| 2014/0118125 A1 | 5/2014 | Bhatia |
| 2014/0118126 A1 | 5/2014 | Garg et al. |
| 2014/0119244 A1 | 5/2014 | Steer et al. |
| 2014/0125467 A1 | 5/2014 | Da Costa et al. |
| 2014/0139327 A1 | 5/2014 | Bau et al. |
| 2014/0176415 A1 | 6/2014 | Buuck et al. |
| 2014/0205260 A1 | 7/2014 | Lacroix et al. |
| 2014/0222377 A1 | 8/2014 | Bitan et al. |
| 2014/0226068 A1 | 8/2014 | Lacroix et al. |
| 2014/0253303 A1 | 9/2014 | Levesque |
| 2014/0286513 A1* | 9/2014 | Hillbratt ............ G01R 31/2829 381/326 |
| 2014/0292501 A1 | 10/2014 | Lim et al. |
| 2014/0300454 A1 | 10/2014 | Lacroix et al. |
| 2014/0340209 A1 | 11/2014 | Lacroix et al. |
| 2014/0347176 A1 | 11/2014 | Modarres et al. |
| 2015/0010176 A1 | 1/2015 | Scheveiw et al. |
| 2015/0201294 A1 | 1/2015 | Risberg et al. |
| 2015/0049882 A1 | 2/2015 | Chiu et al. |
| 2015/0061846 A1 | 3/2015 | Yliaho |
| 2015/0070149 A1 | 3/2015 | Cruz-Hernandez et al. |
| 2015/0070151 A1 | 3/2015 | Cruz-Hernandez et al. |
| 2015/0070154 A1 | 3/2015 | Levesque et al. |
| 2015/0070260 A1 | 3/2015 | Saboune et al. |
| 2015/0077324 A1 | 3/2015 | Birnbaum et al. |
| 2015/0084752 A1 | 3/2015 | Heubel et al. |
| 2015/0116205 A1 | 4/2015 | Westerman et al. |
| 2015/0130767 A1 | 5/2015 | Myers et al. |
| 2015/0154966 A1 | 6/2015 | Bharitkar et al. |
| 2015/0204925 A1* | 7/2015 | Hernandez ............ G01R 27/02 702/65 |
| 2015/0208189 A1 | 7/2015 | Tsai |
| 2015/0216762 A1 | 8/2015 | Oohashi et al. |
| 2015/0234464 A1 | 8/2015 | Yliaho |
| 2015/0249888 A1 | 9/2015 | Bogdanov |
| 2015/0264455 A1 | 9/2015 | Granoto et al. |
| 2015/0268768 A1 | 9/2015 | Woodhull et al. |
| 2015/0324116 A1 | 11/2015 | Marsden et al. |
| 2015/0325116 A1 | 11/2015 | Umminger, III |
| 2015/0339898 A1 | 11/2015 | Saboune et al. |
| 2015/0341714 A1 | 11/2015 | Ahn et al. |
| 2015/0355259 A1 | 12/2015 | Sartler et al. |
| 2015/0356981 A1 | 12/2015 | Johnson et al. |
| 2015/0359452 A1* | 12/2015 | Giovangrandi ....... A61B 5/0245 600/547 |
| 2016/0004311 A1 | 1/2016 | Yliaho |
| 2016/0007095 A1 | 1/2016 | Lacroix |
| 2016/0063826 A1 | 3/2016 | Morrell et al. |
| 2016/0070353 A1 | 3/2016 | Lacroix et al. |
| 2016/0070392 A1 | 3/2016 | Wang et al. |
| 2016/0074278 A1 | 3/2016 | Muench et al. |
| 2016/0097662 A1 | 4/2016 | Chang et al. |
| 2016/0103489 A1* | 4/2016 | Cruz-Hernandez ...... G06F 1/163 345/161 |
| 2016/0132118 A1 | 5/2016 | Park et al. |
| 2016/0155305 A1 | 6/2016 | Barsilai et al. |
| 2016/0162031 A1 | 6/2016 | Westerman et al. |
| 2016/0179203 A1 | 6/2016 | Modarres et al. |
| 2016/0187987 A1 | 6/2016 | Ulrich et al. |
| 2016/0195930 A1 | 7/2016 | Venkatesan et al. |
| 2016/0227614 A1 | 8/2016 | Lissoni et al. |
| 2016/0239089 A1 | 8/2016 | Taninaka et al. |
| 2016/0246378 A1 | 8/2016 | Sampanes et al. |
| 2016/0277821 A1 | 9/2016 | Kunimoto |
| 2016/0291731 A1 | 10/2016 | Liu et al. |
| 2016/0305996 A1* | 10/2016 | Märtens ............... G01R 27/02 |
| 2016/0328065 A1 | 11/2016 | Johnson et al. |
| 2016/0358605 A1 | 12/2016 | Ganong, III et al. |
| 2017/0052593 A1 | 2/2017 | Jiang et al. |
| 2017/0078804 A1 | 3/2017 | Guo et al. |
| 2017/0083096 A1 | 3/2017 | Rihn et al. |
| 2017/0090572 A1 | 3/2017 | Holenarsipur et al. |
| 2017/0090573 A1 | 3/2017 | Hajati et al. |
| 2017/0097381 A1* | 4/2017 | Stephens ............... G01R 27/26 |
| 2017/0131131 A1* | 5/2017 | Keech ................. G01F 1/588 |
| 2017/0153760 A1 | 6/2017 | Chawda et al. |
| 2017/0168574 A1 | 6/2017 | Zhang |
| 2017/0168773 A1 | 6/2017 | Keller et al. |
| 2017/0169674 A1* | 6/2017 | Macours ............... G06F 3/016 |
| 2017/0180863 A1 | 6/2017 | Biggs et al. |
| 2017/0220197 A1 | 8/2017 | Matsumoto et al. |
| 2017/0256145 A1* | 9/2017 | Macours ............... G06F 3/016 |
| 2017/0277350 A1 | 9/2017 | Wang et al. |
| 2017/0277360 A1 | 9/2017 | Breedvelt-Shouten et al. |
| 2017/0031495 A1 | 12/2017 | Tse |
| 2017/0357440 A1 | 12/2017 | Tse |
| 2018/0021811 A1 | 1/2018 | Kutej et al. |
| 2018/0033946 A1 | 2/2018 | Kemppinen et al. |
| 2018/0059733 A1 | 3/2018 | Gault et al. |
| 2018/0059793 A1 | 3/2018 | Hajati |
| 2018/0067557 A1 | 3/2018 | Robert et al. |
| 2018/0074637 A1 | 3/2018 | Rosenberg et al. |
| 2018/0076787 A1* | 3/2018 | Fang .................... H03H 7/38 |
| 2018/0082673 A1 | 3/2018 | Tzanetos |
| 2018/0084362 A1 | 3/2018 | Zhang et al. |
| 2018/0095596 A1 | 4/2018 | Turgeman |
| 2018/0139538 A1 | 5/2018 | Macours |
| 2018/0151036 A1 | 5/2018 | Cha et al. |
| 2018/0158289 A1 | 6/2018 | Vasilev et al. |
| 2018/0159452 A1 | 6/2018 | Eke et al. |
| 2018/0159457 A1 | 6/2018 | Eke |

(56) References Cited

U.S. PATENT DOCUMENTS

| | | |
|---|---|---|
| 2018/0159545 A1 | 6/2018 | Eke et al. |
| 2018/0160227 A1 | 6/2018 | Lawrence et al. |
| 2018/0165925 A1 | 6/2018 | Israr et al. |
| 2018/0178114 A1 | 6/2018 | Mizuta et al. |
| 2018/0182212 A1 | 6/2018 | Li et al. |
| 2018/0183372 A1 | 6/2018 | Li et al. |
| 2018/0194369 A1 | 7/2018 | Lisseman et al. |
| 2018/0196567 A1 | 7/2018 | Klein et al. |
| 2018/0224963 A1 | 8/2018 | Lee et al. |
| 2018/0227063 A1 | 8/2018 | Heubel et al. |
| 2018/0237033 A1 | 8/2018 | Hakeem et al. |
| 2018/0206282 A1 | 9/2018 | Singh |
| 2018/0253123 A1 | 9/2018 | Levesque et al. |
| 2018/0255411 A1 | 9/2018 | Lin et al. |
| 2018/0267897 A1 | 9/2018 | Jeong |
| 2018/0294757 A1 | 10/2018 | Feng et al. |
| 2018/0301060 A1 | 10/2018 | Israr et al. |
| 2018/0304310 A1 | 10/2018 | Long et al. |
| 2018/0321056 A1 | 11/2018 | Yoo et al. |
| 2018/0321748 A1 | 11/2018 | Rao et al. |
| 2018/0323725 A1 | 11/2018 | Cox et al. |
| 2018/0329172 A1 | 11/2018 | Tabuchi |
| 2018/0335848 A1 | 11/2018 | Moussette et al. |
| 2018/0367897 A1 | 12/2018 | Bjork et al. |
| 2019/0020760 A1 | 1/2019 | DeBates et al. |
| 2019/0033348 A1 | 1/2019 | Zeleznik et al. |
| 2019/0035235 A1 | 1/2019 | Da Costa et al. |
| 2019/0227628 A1 | 1/2019 | Rand et al. |
| 2019/0044651 A1 | 2/2019 | Nakada |
| 2019/0049499 A1* | 2/2019 | Eissner ............ G01R 27/2611 |
| 2019/0051229 A1 | 2/2019 | Ozguner et al. |
| 2019/0064925 A1 | 2/2019 | Kim et al. |
| 2019/0069088 A1 | 2/2019 | Seiler |
| 2019/0073078 A1 | 3/2019 | Sheng et al. |
| 2019/0102031 A1 | 4/2019 | Shutzberg et al. |
| 2019/0103829 A1 | 4/2019 | Vasudevan et al. |
| 2019/0138098 A1 | 5/2019 | Shah |
| 2019/0163234 A1 | 5/2019 | Kim et al. |
| 2019/0196596 A1 | 6/2019 | Yokoyama et al. |
| 2019/0206396 A1 | 7/2019 | Chen |
| 2019/0215349 A1 | 7/2019 | Adams et al. |
| 2019/0220095 A1 | 7/2019 | Ogita et al. |
| 2019/0228619 A1 | 7/2019 | Yokoyama et al. |
| 2019/0114496 A1 | 8/2019 | Lesso |
| 2019/0235629 A1 | 8/2019 | Hu et al. |
| 2019/0253031 A1 | 8/2019 | Vellanki et al. |
| 2019/0294247 A1 | 9/2019 | Hu et al. |
| 2019/0295755 A1 | 9/2019 | Konradi et al. |
| 2019/0296674 A1 | 9/2019 | Janko et al. |
| 2019/0297418 A1 | 9/2019 | Stahl |
| 2019/0305851 A1 | 10/2019 | Vegas-Olmos et al. |
| 2019/0311590 A1 | 10/2019 | Doy et al. |
| 2019/0341903 A1 | 11/2019 | Kim |
| 2019/0384393 A1 | 12/2019 | Cruz-Hernandez et al. |
| 2019/0384898 A1 | 12/2019 | Chen et al. |
| 2020/0117506 A1 | 4/2020 | Chan |
| 2020/0139403 A1 | 5/2020 | Palit |
| 2020/0150767 A1 | 5/2020 | Karimi Eskandary et al. |
| 2020/0218352 A1 | 7/2020 | Macours et al. |
| 2020/0231085 A1 | 7/2020 | Kunii et al. |
| 2020/0300920 A1* | 9/2020 | Christophersen ...... H01M 10/48 |
| 2020/0306796 A1 | 10/2020 | Lindemann et al. |
| 2020/0313529 A1 | 10/2020 | Lindemann et al. |
| 2020/0313654 A1 | 10/2020 | Marchais et al. |
| 2020/0314969 A1 | 10/2020 | Marchais et al. |
| 2020/0342724 A1 | 10/2020 | Marchais et al. |
| 2020/0348249 A1 | 11/2020 | Marchais et al. |
| 2020/0395908 A1 | 12/2020 | Schindler et al. |
| 2020/0401292 A1 | 12/2020 | Lorenz et al. |
| 2020/0403546 A1 | 12/2020 | Janko et al. |
| 2021/0108975 A1 | 4/2021 | Peso Parada et al. |
| 2021/0125469 A1 | 4/2021 | Alderson |
| 2021/0153562 A1 | 5/2021 | Fishwick et al. |
| 2021/0157436 A1 | 5/2021 | Peso Parada et al. |
| 2021/0174777 A1 | 6/2021 | Marchais et al. |
| 2021/0175869 A1 | 6/2021 | Taipale |
| 2021/0200316 A1 | 7/2021 | Das et al. |
| 2021/0325967 A1 | 10/2021 | Khenkin et al. |
| 2021/0328535 A1 | 10/2021 | Khenkin et al. |
| 2021/0360347 A1 | 11/2021 | Aschieri |
| 2021/0365118 A1 | 11/2021 | Rajapurkar et al. |
| 2022/0026989 A1 | 1/2022 | Rao et al. |
| 2022/0328752 A1 | 10/2022 | Lesso et al. |
| 2022/0404398 A1 | 12/2022 | Reynaga et al. |
| 2022/0408181 A1 | 12/2022 | Hendrix et al. |

FOREIGN PATENT DOCUMENTS

| | | | |
|---|---|---|---|
| CN | 103403796 A | 11/2013 | |
| CN | 104811838 A | 7/2015 | |
| CN | 204903757 U | 12/2015 | |
| CN | 105264551 A | 1/2016 | |
| CN | 106438890 A | 2/2017 | |
| CN | 106950832 A | 7/2017 | |
| CN | 107665051 A | 2/2018 | |
| CN | 107835968 A | 3/2018 | |
| CN | 210628147 U | 5/2020 | |
| CN | 113268138 A | 8/2021 | |
| CN | 114237414 A | 3/2022 | |
| EP | 0784844 B1 | 6/2005 | |
| EP | 2306269 A1 | 4/2011 | |
| EP | 2363785 A1 | 9/2011 | |
| EP | 2487780 A1 | 8/2012 | |
| EP | 2600225 A1 | 6/2013 | |
| EP | 2846218 A1 | 3/2015 | |
| EP | 2846229 A1 | 3/2015 | |
| EP | 2846229 A2 | 3/2015 | |
| EP | 2846329 A1 | 3/2015 | |
| EP | 2988528 A1 | 2/2016 | |
| EP | 3125508 A1 | 2/2017 | |
| EP | 3379382 A1 | 9/2018 | |
| EP | 3546035 A1 | 10/2019 | |
| EP | 3937379 A1 | 1/2022 | |
| GB | 2526881 A | * 12/2015 | ............ G01K 13/00 |
| GB | 201620746 A | 1/2017 | |
| GB | 2526881 B | 10/2017 | |
| GB | 2606309 A | 11/2022 | |
| IN | 201747044027 | 8/2018 | |
| JP | H02130433 B2 | 5/1990 | |
| JP | H08149006 A | 6/1996 | |
| JP | H10184782 A | 7/1998 | |
| JP | 6026751 B2 | 11/2016 | |
| JP | 6250985 | 12/2017 | |
| JP | 6321351 | 5/2018 | |
| KR | 20120126446 A | 11/2012 | |
| WO | 2013104919 A1 | 7/2013 | |
| WO | 2013186845 A1 | 12/2013 | |
| WO | 2014018086 A1 | 1/2014 | |
| WO | 2014094283 A1 | 6/2014 | |
| WO | 2016105496 A1 | 6/2016 | |
| WO | 2016164193 A1 | 10/2016 | |
| WO | 2017034973 A1 | 3/2017 | |
| WO | 2017113651 A1 | 7/2017 | |
| WO | 2017113652 A1 | 7/2017 | |
| WO | 2018053159 A1 | 3/2018 | |
| WO | 2018067613 A1 | 4/2018 | |
| WO | 2018125347 A1 | 7/2018 | |
| WO | 2020004840 A1 | 1/2020 | |
| WO | 2020055405 A1 | 3/2020 | |

OTHER PUBLICATIONS

Second Office Action, National Intellectual Property Administration, PRC, Application No. 2019800208570, issued Jan. 19, 2022.

Steinbach et al., Haptic Data Compression and Communication, IEEE Signal Processing Magazine, Jan. 2011.

Pezent et al., Syntacts Open-Source Software and Hardware for Audio-Controlled Haptics, IEEE Transactions on Haptics, vol. 14, No. 1, Jan.-Mar. 2021.

Danieau et al., Enhancing Audiovisual Experience with Haptic Feedback: A Survey on HAV, IEEE Transactions on Haptics, vol. 6, No. 2, Apr.-Jun. 2013.

(56) References Cited

OTHER PUBLICATIONS

Danieau et al., Toward Haptic Cinematography: Enhancing Movie Experiences with Camera-Based Haptic Effects, IEEE Computer Society, IEEE MultiMedia, Apr.-Jun. 2014.
Jaijongrak et al., A Haptic and Auditory Assistive User Interface: Helping the Blinds on their Computer Operations, 2011 IEEE International Conference on Rehabilitation Robotics, Rehab Week Zurich, ETH Zurich Science City, Switzerland, Jun. 29-Jul. 1, 2011.
Lim et al., An Audio-Haptic Feedbacks for Enhancing User Experience in Mobile Devices, 2013 IEEE International Conference on Consumer Electronics (ICCE).
Weddle et al., How Does Audio-Haptic Enhancement Influence Emotional Response to Mobile Media, 2013 Fifth International Workshop on Quality of Multimedia Experience (QoMEX), QMEX 2013.
Final Notice of Preliminary Rejection, Korean Patent Office, Application No. 10-2019-7036236, mailed Nov. 29, 2021.
Examination Report, United Kingdom Intellectual Property Office, Application No. GB2018051.9, mailed Nov. 5, 2021.
Examination Report under Section 18(3), United Kingdom Intellectual Property Office, Application No. GB2106247.6, mailed Mar. 31, 2022.
First Examination Opinion Notice, State Intellectual Property Office of the People's Republic of China, Application No. 201880037435. X, issued Dec. 31, 2020.
International Search Report and Written Opinion of the International Searching Authority, International Application No. PCT/GB2019/050964, mailed Sep. 3, 2019.
International Search Report and Written Opinion of the International Searching Authority, International Application No. PCT/GB2019/050770, mailed Jul. 5, 2019.
Communication Relating to the Results of the Partial International Search, and Provisional Opinion Accompanying the Partial Search Result, of the International Searching Authority, International Application No. PCT/US2018/031329, mailed Jul. 20, 2018.
Combined Search and Examination Report, UKIPO, Application No. GB1720424.9, mailed Jun. 5, 2018.
Examination Report under Section 18(3), UKIPO, Application No. GB2112207.2, mailed Nov. 7, 2022.
Examination Report, Intellectual Property India, Application No. 202117019138, mailed Jan. 4, 2023.
Combined Search and Examination Report under Sections 17 and 18(3), UKIPO, Application No. GB2210174.5, mailed Aug. 1, 2022.
Examination Report under Sections 17 and 18(3), UKIPO, Application No. GB2112207.2, mailed Aug. 18, 2022.
International Search Report and Written Opinion of the International Searching Authority, International Application No. PCT/US2022/030541, mailed Sep. 1, 2022.
Vanderborght, B. et al., Variable impedance actuators: A review; Robotics and Autonomous Systems 61, Aug. 6, 2013, pp. 1601-1614.
International Search Report and Written Opinion of the International Searching Authority, International Application No. PCT/US2022/033190, mailed Sep. 8, 2022.
International Search Report and Written Opinion of the International Searching Authority, International Application No. PCT/US2022/033230, mailed Sep. 15, 2022.
Examination Report under Section 18(3), UKIPO, Application No. GB2115048.7, mailed Aug. 24, 2022.
Communication pursuant to Article 94(3) EPC, European Patent Office, Application No. 18727512.8, mailed Sep. 26, 2022.
Invitation to Pay Additional Fees, Partial International Search Report and Provisional Opinion of the International Searching Authority, International Application No. PCT/US2020/052537, mailed Jan. 14, 2021.
International Search Report and Written Opinion of the International Searching Authority, International Application No. PCT/US2020/056610, mailed Jan. 21, 2021.
International Search Report and Written Opinion of the International Searching Authority, International Application No. PCT/GB2020/052537, mailed Mar. 9, 2021.
International Search Report and Written Opinion of the International Searching Authority, International Application No. PCT/GB2019/052991, dated Mar. 17, 2020, received by Applicant Mar. 19, 2020.
International Search Report and Written Opinion of the International Searching Authority, International Application No. PCT/GB2020/050823, mailed Jun. 30, 2020.
International Search Report and Written Opinion of the International Searching Authority, International Application No. PCT/GB2020/051037, mailed Jul. 9, 2020.
Communication Relating to the Results of the Partial International Search, and Provisional Opinion Accompanying the Partial Search Result, of the International Searching Authority, International Application No. PCT/GB2020/050822, mailed Jul. 9, 2020.
International Search Report and Written Opinion of the International Searching Authority, International Application No. PCT/GB2020/051035, mailed Jul. 10, 2020.
Examination Report under Section 18(3), UKIPO, Application No. GB2113228.7, mailed Feb. 10, 2023.
Examination Report under Section 18(3), UKIPO, Application No. GB2113154.5, mailed Feb. 17, 2023.
First Office Action, China National Intellectual Property Administration, Application No. 2019107179621, mailed Jan. 19, 2023.
Office Action of the Intellectual Property Office, ROC (Taiwan) Patent Application No. 107115475, issued Apr. 30, 2021.
First Office Action, China National Intellectual Property Administration, Patent Application No. 2019800208570, Issued Jun. 3, 2021.
International Search Report and Written Opinion of the International Searching Authority, International Application No. PCT/US2021/021908, mailed Jun. 9, 2021.
Notice of Preliminary Rejection, Korean Intellectual Property Office, Application No. 10-2019-7036236, mailed Jun. 29, 2021.
Combined Search and Examination Report, United Kingdom Intellectual Property Office, Application No. GB2018051.9, mailed Jun. 30, 2021.
Communication pursuant to Rule 164(2)(b) and Article 94(3) EPC, European Patent Office, Application No. 18727512.8, mailed Jul. 8, 2021.
Gottfried Behler: "Measuring the Loudspeaker's Impedance during Operation for the Derivation of the Voice Coil Temperature", AES Convention Preprint, Feb. 25, 1995 (Feb. 25, 1995), Paris.
First Office Action, China National Intellectual Property Administration, Patent Application No. 2019800211287, Issued Jul. 5, 2021.
International Search Report and Written Opinion of the International Searching Authority, International Application No. PCT/US2020/024864, mailed Jul. 6, 2020.
International Search Report and Written Opinion of the International Searching Authority, International Application No. PCT/GB2020/050822, mailed Aug. 31, 2020.
International Search Report and Written Opinion of the International Searching Authority, International Application No. PCT/GB2020/051438, mailed Sep. 28, 2020.
Examination Report under Section 18(3), UKIPO, Application No. GB2117488.3, mailed Apr. 27, 2023.
Second Office Action, National Intellectual Property Administration, PRC, Application No. 2019107179621, issued May 24, 2023.
Examination Report under Section 18(3), UKIPO, Application No. GB2113228.7, mailed Jun. 28, 2023.
Combined Search and Examination Report under Sections 17 and 18(3), UKIPO, Application No. GB2204956.3, mailed Jul. 24, 2023.
Notice of Preliminary Rejection, Korean Intellectual Property Office, Application No. 10-2023-7029306, mailed Sep. 19, 2023.
Examination Report under Section 17, UKIPO, Application No. GB2311104.0 mailed Sep. 4, 2023.
Examination Report under Section 17, UKIPO, Application No. GB2311103.2 mailed Sep. 11, 2023.
First Examination Opinion Notice, China National Intellectual Property Administration, Application No. 202210400773.3, issued May 23, 2024.

(56) References Cited

OTHER PUBLICATIONS

First Office Action, China National Intellectual Property Administration, Application No. 2020800313809, issued Jun. 21, 2024.
First Office Action, China National Intellectual Property Administration, Application No. 2019800695497, issued Jul. 18, 2024.

* cited by examiner

| | METHOD | STIMULUS | PARAMETER ESTIMATED | ADVANTAGE |
|---|---|---|---|---|
| USED TO PROVIDE INITIAL Re ESTIMATE PRIOR TO START OF HAPTIC PLAYBACK FOR "CRISP" BEGINNING OF EFFECT | HI PILOT DURING INIT PHASE | TONE ABOVE RESONANCE (~2kHz) FOR 2ms-5ms, INTEGER NUMBER OF CYCLES. | Re DC OFFSETS OF $I(t)$ AND $V_T(t)$ | FAST ESTIMATE NOT BIASED BY SENSOR OFFSET. GET Re AND $V_T(t)$, $I(t)$ OFFSET ESTIMATES. |
| | THERMAL MODEL DURING INIT PHASE | UN-CONSTRAINED. | DELTA IN Re SINCE LAST ESTIMATE USING A PILOT | ROBUST, PRACTICALLY NOISELSS Re ESTIMATE. SIMPLE TO IMPLEMENT. NO LATENCY. NO STIMULUS CONSTRAINT. |
| | LO PILOT DURING BACKGROUND CAL PHASE | TONE BELOW RESONANCE (20Hz) FOR 1 CYCLE OF 50ms. | Re DC OFFSETS OF $I(t)$ AND $V_T(t)$ | SLOW ESTIMATE NOT BIASED BY SENSOR OFFSET. GET Re AND V, $I(t)$ OFFSET ESTIMATES. |
| USED TO TRACK Re ESTIMATE DURING HAPTIC PLAYBACK FOR "CRISP" END OF EFFECT | HI PILOT DURING PLAYBACK PHASE | TONE ABOVE RESONANCE (~2kHz) FOR DURATION OF HAPTIC PLAYBACK. | Re Le | FAST ESTIMATE. EARLY ESTIMATE SLIGHTLY SENSITIVE TO SENSOR OFFSET (FILTER SETTLING TIME). GET BOTH Re AND Le ESTIMATES. |
| | LO PILOT DURING PLAYBACK PHASE | TONE BELOW RESONANCE (20Hz-50Hz) FOR DURATION OF HAPTIC PLAYBACK OR AT LEAST ~50ms. | Re | MOST ACCURATE ESTIMATE OF Re. NO ACOUSTIC RESPONSE. |
| | NO PILOT DURING PLAYBACK PHASE | BROADBAND HAPTIC WAVEFORM. | Re Le | NO UNDESIRED ACOUSTIC RESPONSE. |

FIG. 12B

| DOWNSIDE | USE |
|---|---|
| MAY REQUIRE TEST STIMULUS (e.g. NO HAPTIC SIGNAL). POSSIBLE AUDIBLE ARTIFACT (BUT NOT VERY PERCEPTIBLE SINCE STIMULUS IS VERY SHORT). | DURING INIT PHASE PRIOR TO HAPTIC EFFECT. |
| NEEDS WORK IN CONJUNCTION WITH ANOTHER METHOD TO DETERMINE Re_ambient. OPEN-LOOP SOLUTION MAY HAVE ERRORS:<br>• TIME RECORD INACCURACIES<br>• UN-MODELLED THERMAL SOURCES (e.g> NEARBY CHIP TURNING ON). | IN CONJUNCTION WITH OTHER METHOD. USE TO OBTAIN INITIAL ESTIMATE WHEN NOT USING AS A PILOT DURING INIT PHASE CALIBRATION. |
| MAY REQUIRE TEST STIMULUS (e.g. NO HAPTIC SIGNAL). SLOW. | TO MONITOR CHANGES OF Re WITH AMBIENT TEMPERATURE WHILE NO HAPTIC EFFECT IS PLAYING. THE DSP WAKES-UP FROM HIBERNATION ONCE A MINUTE IN THE BACKGROUND TO AUTOMATICALLY RUN ESTIMATES. |
| MAY HAVE ACOUSTIC RESPONSE. | DURING PLAYBACK PHASE IF ACOUSTIC RESPONSE OF THE LRA AT THE PILOT FREQUENCY IS SUFFICIENTLY LOW AND FAST ESTIMATES OR INDUCTANCE ESTIMATES ARE DESIRED. |
| SLOW ESTIMATE. EARLY ESTIMATE MAY BE SENSITIVE TO SENSOR OFFSET. | DURING PLAYBACK PHASE. |
| MAY NOT HAVE SUFFICIENT CONTENT IN FREQUENCY BANDS FOR LONG ENOUGH DURATION FOR STABLE Re ESTIMATE. | IN SYSTEMS WHICH HAVE EASILY AUDIBLE RESPONSES OF THE TRANSDUCER. |

FROM FIG. 12A

METHODS AND SYSTEMS FOR ESTIMATING COIL IMPEDANCE OF AN ELECTROMAGNETIC TRANSDUCER

RELATED APPLICATION

The present disclosure claims priority to U.S. Provisional Patent Application Ser. No. 62/944,090, filed Dec. 5, 2019, which is incorporated by reference herein in its entirety.

FIELD OF DISCLOSURE

The present disclosure relates in general to estimating a coil impedance of an electromagnetic transducer, in particular a haptic transducer.

BACKGROUND

Vibro-haptic transducers, for example linear resonant actuators (LRAs), are widely used in portable devices such as mobile phones to generate vibrational feedback to a user. Vibro-haptic feedback in various forms creates different feelings of touch to a user's skin, and may play increasing roles in human-machine interactions for modern devices.

An LRA may be modelled as a mass-spring electromechanical vibration system. When driven with appropriately designed or controlled driving signals, an LRA may generate certain desired forms of vibrations. For example, a sharp and clear-cut vibration pattern on a user's finger may be used to create a sensation that mimics a mechanical button click. This clear-cut vibration may then be used as a virtual switch to replace mechanical buttons.

FIG. 1 illustrates an example of a vibro-haptic system in a device 100. Device 100 may comprise a controller 101 configured to control a signal applied to an amplifier 102. Amplifier 102 may then drive a haptic transducer 103 based on the signal. Controller 101 may be triggered by a trigger to output to the signal. The trigger may for example comprise a pressure or force sensor on a screen or virtual button of device 100.

Among the various forms of vibro-haptic feedback, tonal vibrations of sustained duration may play an important role to notify the user of the device of certain predefined events, such as incoming calls or messages, emergency alerts, and timer warnings, etc. In order to generate tonal vibration notifications efficiently, it may be desirable to operate the haptic actuator at its resonance frequency.

The resonance frequency $f_0$ of a haptic transducer may be approximately estimated as:

$$f_0 = \frac{1}{2*\pi*\sqrt{C*M}} \qquad (1)$$

where C is the compliance of the spring system, and M is the equivalent moving mass, which may be determined based on both the actual moving part in the haptic transducer and the mass of the portable device holding the haptic transducer.

Due to sample-to-sample variations in individual haptic transducers, mobile device assembly variations, temporal component changes caused by aging, and use conditions such as various different strengths of a user gripping the device, the vibration resonance of the haptic transducer may vary from time to time.

FIG. 2A illustrates an example of a linear resonant actuator (LRA) modelled as a linear system including a mass-spring system 201. LRAs are non-linear components that may behave differently depending on, for example, the voltage levels applied, the operating temperature, and the frequency of operation. However, these components may be modelled as linear components within certain conditions.

FIG. 2B illustrates an example of an LRA modelled as a linear system, including an electrically equivalent model of mass-spring system 201 of LRA. In this example, the LRA is modelled as a third order system having electrical and mechanical elements. In particular, Re and Le are the DC resistance and coil inductance of the coil-magnet system, respectively; and Bl is the magnetic force factor of the coil. The driving amplifier outputs the voltage waveform V(t) with the output impedance Ro. The terminal voltage $V_T(t)$ may be sensed across the terminals of the haptic transducer. The mass-spring system 201 moves with velocity u(t).

An electromagnetic load such as an LRA may be characterized by its impedance $Z_{LRA}$ as seen as the sum of a coil impedance $Z_{coil}$ and a mechanical impedance $Z_{mech}$:

$$Z_{LRA} = Z_{coil} + Z_{mech} \qquad (2)$$

Coil impedance $Z_{coil}$ may in turn comprise a direct current (DC) resistance Re in series with an inductance Le:

$$Z_{coil} = Re + s*Le \qquad (3)$$

Mechanical impedance $Z_{mech}$ may be defined by three parameters including the resistance at resonance $R_{RES}$ representing an electrical resistance representative of mechanical friction of the mass-spring system of the haptic transducer, a capacitance $C_{MES}$ representing an electrical capacitance representative of an equivalent moving mass M of the mass-spring system of the haptic transducer, and inductance $L_{CES}$ representative of a compliance C of the mass-spring system of the haptic transducer. The electrical equivalent of the total mechanical impedance is the parallel connection of $R_{RES}$, $C_{MES}$, $L_{CES}$. The Laplace transform of this parallel connection is described by:

$$Z_{mech}(s) = \frac{1}{\left(\frac{1}{R_{RES}} + \frac{1}{L_{CES}*s} + C_{MES}*s\right)} \qquad (4)$$

The resonant frequency $f_0$ of the haptic transducer can be represented as:

$$f_0 = \frac{1}{\left(2*\pi*\sqrt{L_{CES}*C_{MES}}*\right)} \qquad (5)$$

The quality factor Q of the LRA can be represented as:

$$Q = \frac{R_{RES}*Re}{R_{RES}+Re} * \sqrt{\frac{C_{MES}}{L_{CES}}} \qquad (6)$$

Referring to equation (6), it may appear non-intuitive that the expression involves a subexpression describing the parallel connection of resistances Re and $R_{RES}$ $$\left(\text{i.e., } \frac{R_{RES}*Re}{R_{RES}+Re}\right)$$

while in FIG. 2B these resistances are shown in a series connection. However, such may be the case where a driving voltage Ve is oscillating but then abruptly turns off and goes to zero. The voltage amplifier shown in FIG. 2B may be considered to have a low source impedance, ideally zero source impedance. Under these conditions, when driving voltage Ve goes to zero, the voltage amplifier effectively disappears from the circuit. At that point, the top-most terminal of resistance Re in FIG. 2B is grounded as is the bottom-most terminal of resistance $R_{RES}$ and so resistances Re and $R_{RES}$ are indeed connected in parallel as reflected in equation (6).

Electromagnetic transducers, such as LRAs or microspeakers, may have slow response times. FIG. 3 is a graph of an example response of an LRA, depicting an example driving signal to the LRA, a current through the LRA, and a back electromotive force (back EMF) of the LRA, wherein such back EMF may be proportional to the velocity of a moving element (e.g., coil or magnet) of the transducer. As shown in FIG. 3, the attack time of the back EMF may be slow as energy is transferred to the LRA, and some "ringing" of the back EMF may occur after the driving signal has ended as the mechanical energy stored in the LRA is discharged. In the context of a haptic LRA, such behavioral characteristic may result in a "mushy" feeling click or pulse, instead of a "crisp" tactile response. Thus, it may be desirable for an LRA to instead have a response similar to that shown in FIG. 4, in which there exists minimal ringing after the driving signal has ended, and which may provide a more "crisp" tactile response in a haptic context. Accordingly, it may be desirable to apply processing to a driving signal such that when the processed driving signal is applied to the transducer, the velocity or back EMF of the transducer more closely approaches that of FIG. 4.

SUMMARY

In accordance with the teachings of the present disclosure, the disadvantages and problems associated with estimating a coil resistance of an electromagnetic transducer may be reduced or eliminated.

In accordance with embodiments of the present disclosure, a method may include selecting, based on a condition of an electromagnetic load, a selected measurement technique from a plurality of impedance measurement techniques for measuring an impedance of the electromagnetic load and performing the selected measurement technique to generate an estimate of the impedance of the electromagnetic load.

In accordance with these and other embodiments of the present disclosure, a system for estimating impedance of an electromagnetic load may be configured to select, based on a condition of the electromagnetic load, a selected measurement technique from a plurality of impedance measurement techniques for measuring an impedance of the electromagnetic load and perform the selected measurement technique to generate an estimate of the impedance of the electromagnetic load.

In accordance with these and other embodiments of the present disclosure, a host device may include an electromagnetic load and a subsystem coupled to the electromagnetic load and configured to select, based on a condition of the electromagnetic load, a selected measurement technique from a plurality of impedance measurement techniques for measuring an impedance of the electromagnetic load and perform the selected measurement technique to generate an estimate of the impedance of the electromagnetic load.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIGS. 12A and 12B (which may be referred to herein as together as "FIG. 12") illustrate a table which summarizes the possible voice coil impedance estimation approaches that the haptic state machine may employ, in accordance with the present disclosure.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively, an electronic device may have a connector, e.g., a socket, for making a removable mating connection with a corresponding connector of an accessory apparatus, and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal will generally be an analog time varying voltage signal, for example, a time varying waveform.

Figure 5:
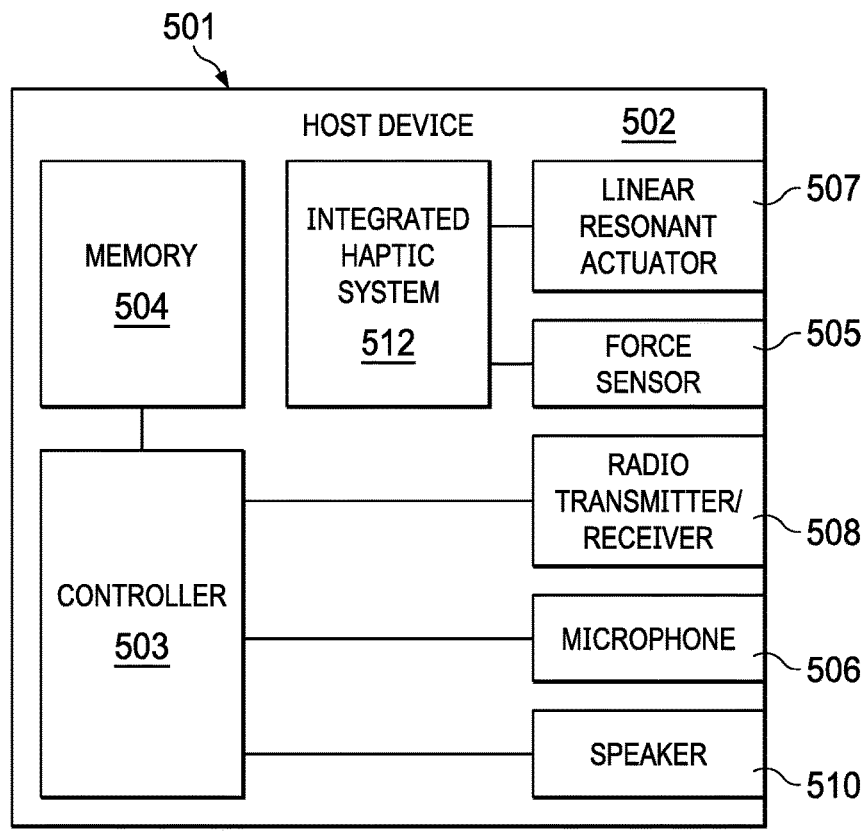
FIG. 5 illustrates a block diagram of selected components of an example mobile device, in accordance with embodiments of the present disclosure.

FIG. 5 illustrates a block diagram of selected components of an example host device 502, in accordance with embodiments of the present disclosure. As shown in FIG. 5, host device 502 may comprise an enclosure 501, a controller 503, a memory 504, a force sensor 505, a microphone 506, a linear resonant actuator 507, a radio transmitter/receiver 508, a speaker 510, and an integrated haptic system 512.

Enclosure 501 may comprise any suitable housing, casing, or other enclosure for housing the various components of host device 502. Enclosure 501 may be constructed from plastic, metal, and/or any other suitable materials. In addition, enclosure 501 may be adapted (e.g., sized and shaped) such that host device 502 is readily transported on a person of a user of host device 502. Accordingly, host device 502 may include but is not limited to a smart phone, a tablet computing device, a handheld computing device, a personal digital assistant, a notebook computer, a video game controller, or any other device that may be readily transported on a person of a user of host device 502.

Controller 503 may be housed within enclosure 501 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 503 interprets and/or executes program instructions and/or processes data stored in memory 504 and/or other computer-readable media accessible to controller 503.

Memory 504 may be housed within enclosure 501, may be communicatively coupled to controller 503, and may include any system, device, or apparatus configured to retain program instructions and/or data for a period of time (e.g., computer-readable media). Memory 504 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to host device 502 is turned off.

Microphone 506 may be housed at least partially within enclosure 501, may be communicatively coupled to controller 503, and may comprise any system, device, or apparatus configured to convert sound incident at microphone 506 to an electrical signal that may be processed by controller 503, wherein such sound is converted to an electrical signal using a diaphragm or membrane having an electrical capacitance that varies as based on sonic vibrations received at the diaphragm or membrane. Microphone 506 may include an electrostatic microphone, a condenser microphone, an electret microphone, a microelectromechanical systems (MEMs) microphone, or any other suitable capacitive microphone.

Radio transmitter/receiver 508 may be housed within enclosure 501, may be communicatively coupled to controller 503, and may include any system, device, or apparatus configured to, with the aid of an antenna, generate and transmit radio-frequency signals as well as receive radio-frequency signals and convert the information carried by such received signals into a form usable by controller 503. Radio transmitter/receiver 508 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 510 may be housed at least partially within enclosure 501 or may be external to enclosure 501, may be communicatively coupled to controller 503, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The coil and the driver's magnetic system interact, generating a mechanical force that causes the coil (and thus, the attached cone) to move back and forth, thereby reproducing sound under the control of the applied electrical signal coming from the amplifier.

Force sensor 505 may be housed within enclosure 501, and may include any suitable system, device, or apparatus for sensing a force, a pressure, or a touch (e.g., an interaction with a human finger) and generating an electrical or electronic signal in response to such force, pressure, or touch. In some embodiments, such electrical or electronic signal may be a function of a magnitude of the force, pressure, or touch applied to the force sensor. In these and other embodiments, such electronic or electrical signal may comprise a general purpose input/output signal (GPIO) associated with an input signal to which haptic feedback is given. Force sensor 505 may include, without limitation, a capacitive displacement sensor, an inductive force sensor (e.g., a resistive-inductive-capacitive sensor), a strain gauge, a piezoelectric force sensor, a force sensing resistor, a piezoelectric force sensor, a thin film force sensor, or a quantum tunneling composite-based force sensor. For purposes of clarity and exposition in this disclosure, the term "force" as used herein may refer not only to force, but to physical quantities indicative of force or analogous to force, such as, but not limited to, pressure and touch.

Linear resonant actuator 507 may be housed within enclosure 501, and may include any suitable system, device, or apparatus for producing an oscillating mechanical force across a single axis. For example, in some embodiments, linear resonant actuator 507 may rely on an alternating current voltage to drive a voice coil pressed against a moving mass connected to a spring. When the voice coil is driven at the resonant frequency of the spring, linear resonant actuator 507 may vibrate with a perceptible force. Thus, linear resonant actuator 507 may be useful in haptic applications within a specific frequency range. While, for the purposes of clarity and exposition, this disclosure is described in relation to the use of linear resonant actuator 507, it is understood that any other type or types of vibrational actuators (e.g., eccentric rotating mass actuators) may be used in lieu of or in addition to linear resonant actuator 507. In addition, it is also understood that actuators arranged to produce an oscillating mechanical force across multiple axes may be used in lieu of or in addition to linear resonant actuator 507. As described elsewhere in this disclosure, a linear resonant actuator 507, based on a signal received from integrated haptic system 512, may render haptic feedback to a user of host device 502 for at least one of mechanical button replacement and capacitive sensor feedback.

Integrated haptic system 512 may be housed within enclosure 501, may be communicatively coupled to force sensor 505 and linear resonant actuator 507, and may include any system, device, or apparatus configured to receive a signal from force sensor 505 indicative of a force applied to host device 502 (e.g., a force applied by a human finger to a virtual button of host device 502) and generate an electronic signal for driving linear resonant actuator 507 in response to the force applied to host device 502. Detail of an example integrated haptic system in accordance with embodiments of the present disclosure is depicted in FIG. 6.

Although specific example components are depicted above in FIG. 5 as being integral to host device 502 (e.g., controller 503, memory 504, force sensor 506, microphone 506, radio transmitter/receiver 508, speakers(s) 510), a host device 502 in accordance with this disclosure may comprise one or more components not specifically enumerated above. For example, although FIG. 5 depicts certain user interface components, host device 502 may include one or more other user interface components in addition to those depicted in FIG. 5 (including but not limited to a keypad, a touch screen, and a display), thus allowing a user to interact with and/or otherwise manipulate host device 502 and its associated components.

Figure 6:
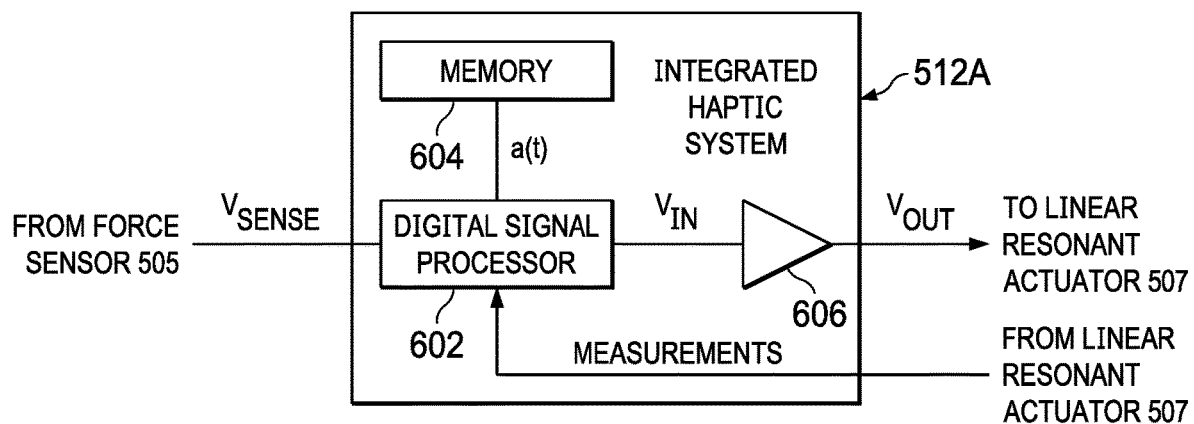
FIG. 6 illustrates a block diagram of selected components of an example integrated haptic system, in accordance with embodiments of the present disclosure.

FIG. 6 illustrates a block diagram of selected components of an example integrated haptic system 512A, in accordance with embodiments of the present disclosure. In some embodiments, integrated haptic system 512A may be used to implement integrated haptic system 512 of FIG. 5. As shown in FIG. 6, integrated haptic system 512A may include a digital signal processor (DSP) 602, a memory 604, and an amplifier 606.

DSP 602 may include any system, device, or apparatus configured to interpret and/or execute program instructions and/or process data. In some embodiments, DSP 602 may interpret and/or execute program instructions and/or process data stored in memory 604 and/or other computer-readable media accessible to DSP 602.

Memory 604 may be communicatively coupled to DSP 602, and may include any system, device, or apparatus configured to retain program instructions and/or data for a period of time (e.g., computer-readable media). Memory 604 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to host device 502 is turned off.

Amplifier 606 may be electrically coupled to DSP 602 and may comprise any suitable electronic system, device, or apparatus configured to increase the power of an input signal $V_{IN}$ (e.g., a time-varying voltage or current) to generate an output signal $V_{OUT}$. For example, amplifier 606 may use electric power from a power supply (not explicitly shown) to increase the amplitude of a signal. Amplifier 606 may include any suitable amplifier class, including without limitation, a Class-D amplifier.

In operation, memory 604 may store one or more haptic playback waveforms. In some embodiments, each of the one or more haptic playback waveforms may define a haptic response a(t) as a desired acceleration of a linear resonant actuator (e.g., linear resonant actuator 507) as a function of time. DSP 602 may be configured to receive a force signal $V_{SENSE}$ indicative of force applied to force sensor 505. Either in response to receipt of force signal $V_{SENSE}$ indicating a sensed force or independently of such receipt, DSP 602 may retrieve a haptic playback waveform from memory 604 and process such haptic playback waveform to determine a processed haptic playback signal $V_{IN}$. In embodiments in which amplifier 606 is a Class D amplifier, processed haptic playback signal $V_{IN}$ may comprise a pulse-width modulated signal. In response to receipt of force signal $V_{SENSE}$ indicating a sensed force, DSP 602 may cause processed haptic playback signal $V_{IN}$ to be output to amplifier 606, and amplifier 606 may amplify processed haptic playback signal $V_{IN}$ to generate a haptic output signal $V_{OUT}$ for driving linear resonant actuator 507.

In some embodiments, integrated haptic system 512A may be formed on a single integrated circuit, thus enabling lower latency than existing approaches to haptic feedback control. By providing integrated haptic system 512A as part of a single monolithic integrated circuit, latencies between various interfaces and system components of integrated haptic system 512A may be reduced or eliminated.

Figure 1:
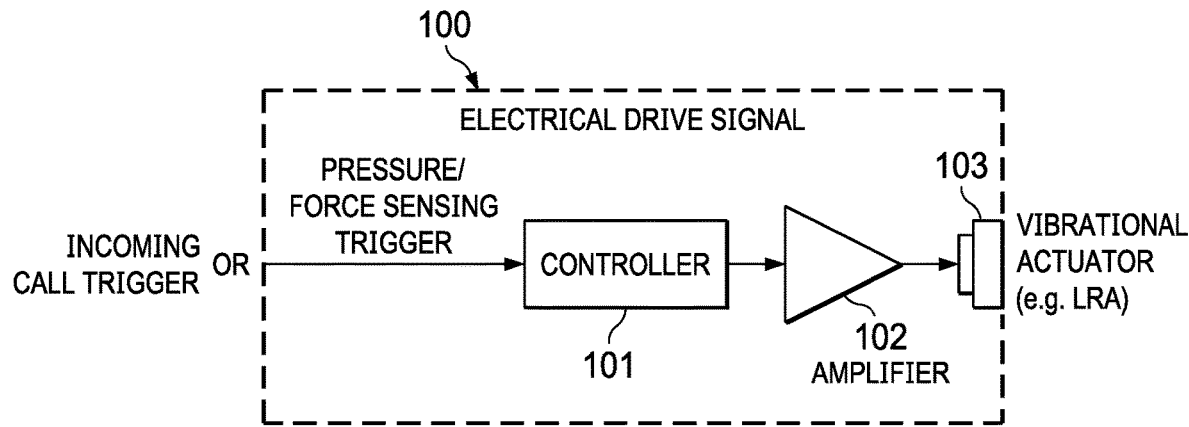
FIG. 1 illustrates an example of a vibro-haptic system in a device, as is known in the art.
Figure 2A:
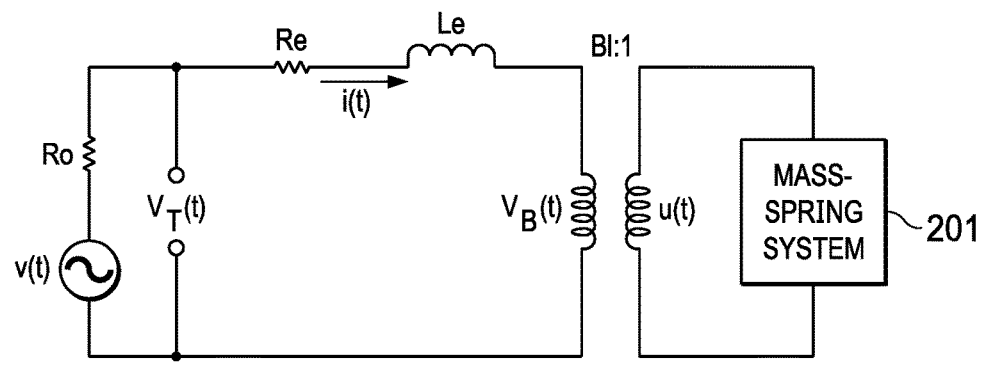
FIGS. 2A and 2B each illustrate an example of a Linear Resonant Actuator (LRA) modelled as a linear system, as is known in the art.
Figure 2B:
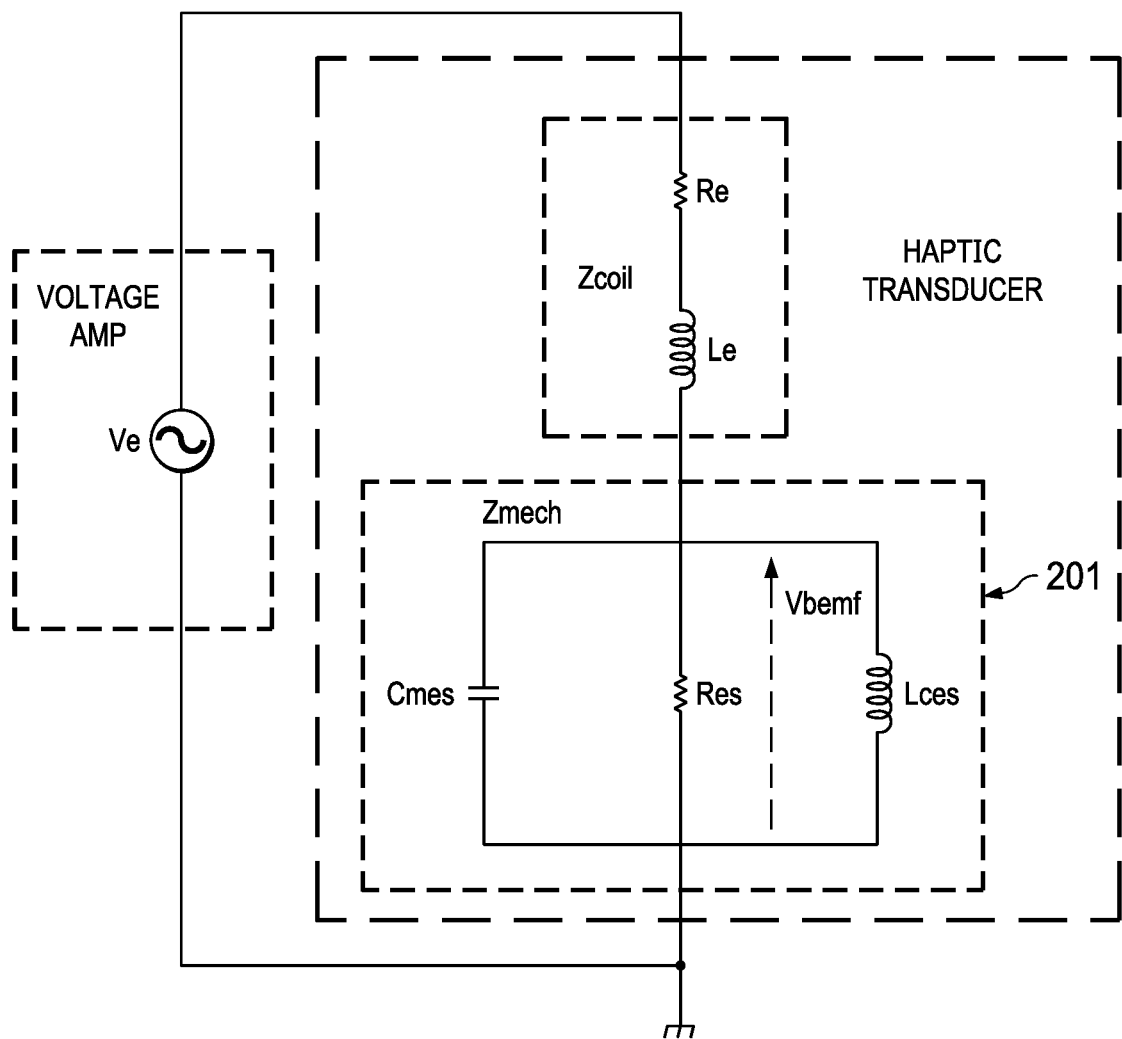
Figure 3:
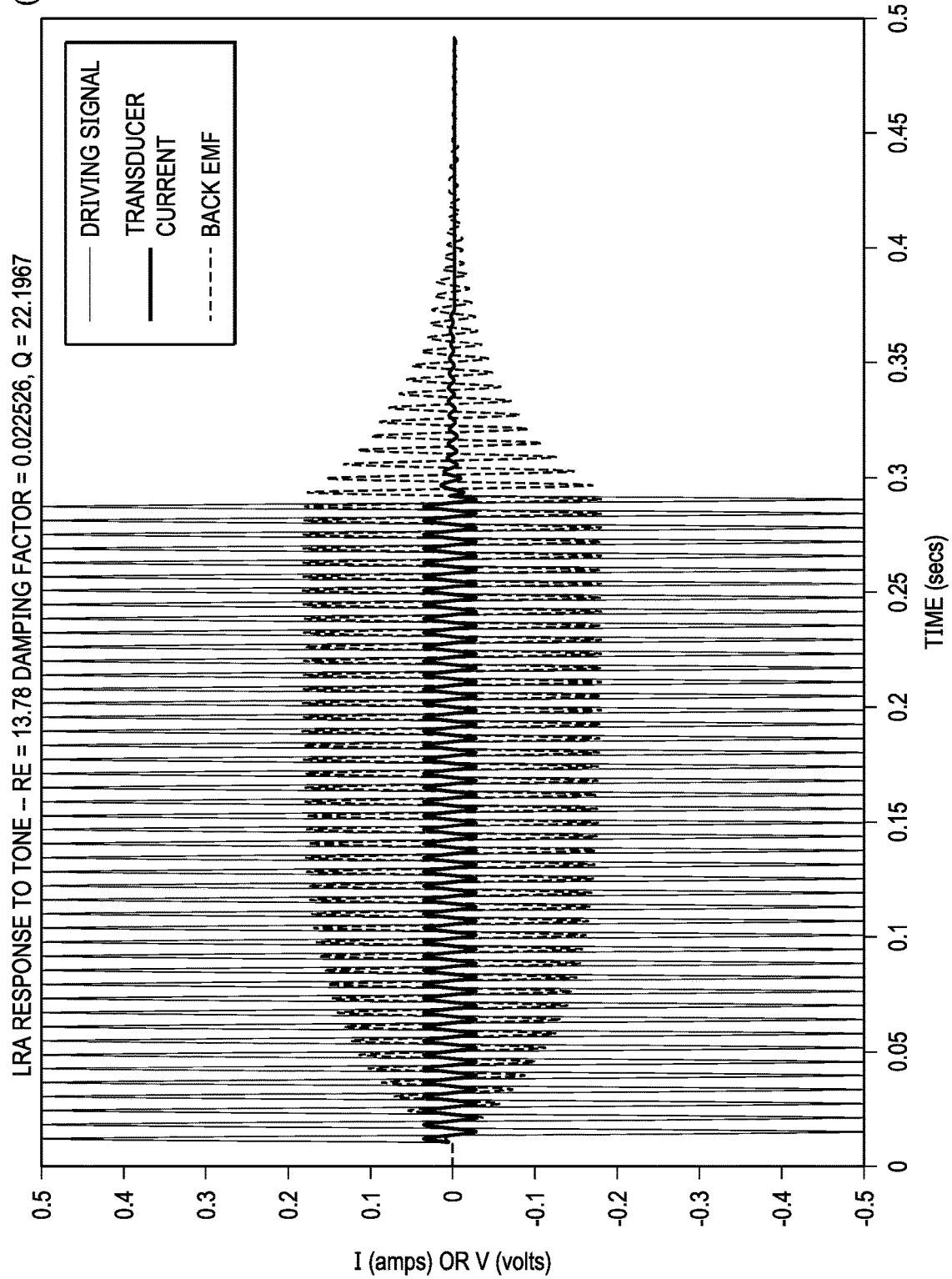
FIG. 3 illustrates a graph of example waveforms of an electromagnetic load, as is known in the art.
Figure 4:
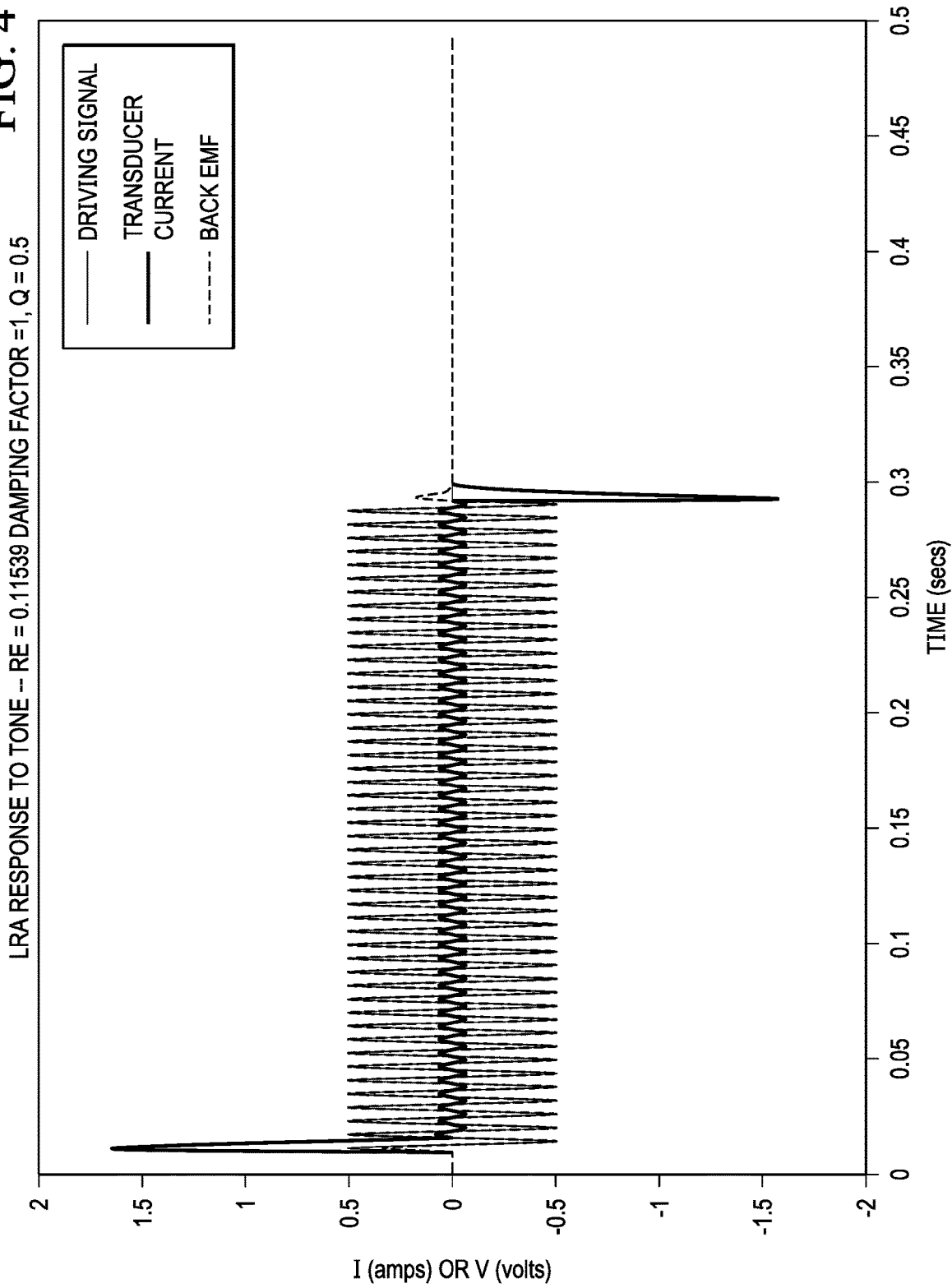
FIG. 4 illustrates a graph of desirable example waveforms of an electromagnetic load, in accordance with embodiments of the present disclosure.

The problem illustrated in FIG. 3 may result from a linear resonant actuator 507 with a high quality factor q with a sharp peak in impedance at a resonant frequency $f_0$ of linear resonant actuator 507.

Figure 7:
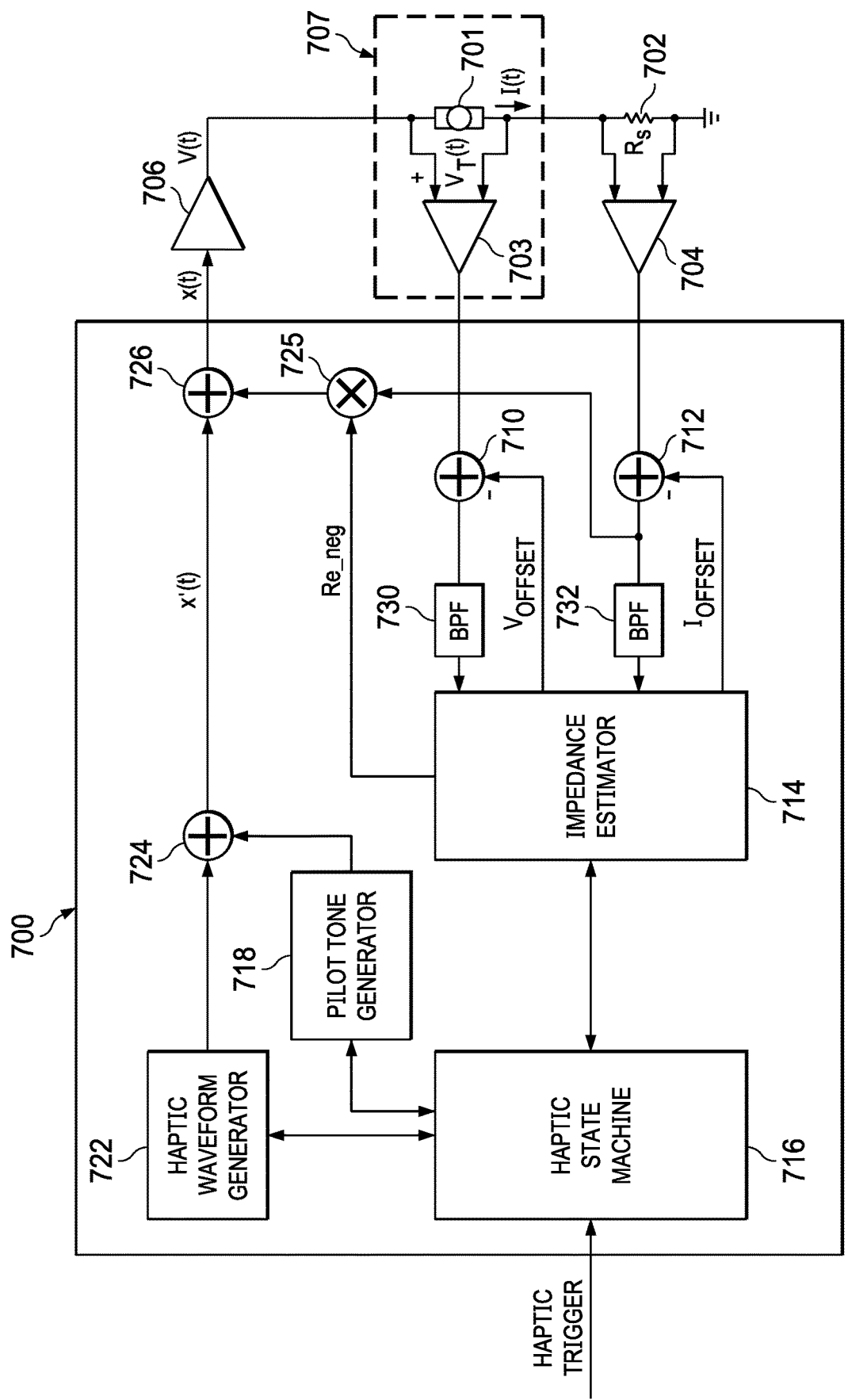
FIG. 7 illustrates an example system for improving transducer dynamics, in accordance with embodiments of the present disclosure.

FIG. 7 illustrates an example system 700 for improving dynamics of an electromagnetic load 701, in accordance with embodiments of the present disclosure. In some embodiments, system 700 may be integral to a host device (e.g., host device 502) comprising system 700 and electromagnetic load 701.

In operation, a haptic waveform generator 722 of a system 700 of a host device may generate (in the absence of a pilot tone generated by pilot tone generator 718) a raw transducer driving signal x'(t) comprising a haptic waveform signal or audio signal. In some embodiments, raw transducer driving signal x'(t) may be generated based on stored haptic waveforms and/or dynamically-generated haptic waveforms stored by haptic waveform generator 722 or a memory (e.g., memory 604) accessible to haptic waveform generator 722.

Raw transducer driving signal x'(t) may be received by combiner 726 which may combine raw transducer driving signal x'(t) with a correction term from multiplier 725 to generate transducer driving signal x(t) in order to effectively cancel some or all of a coil impedance of electromagnetic load 701, as described in greater detail below. Also as described below, by effectively reducing the coil resistance of electromagnetic load 701, system 700 may also reduce an effective quality factor q of electromagnetic load 701, which may in turn decrease attack time and minimize ringing occurring after the raw transducer driving signal has ended. Although FIG. 7 depicts a virtual negative resistance being applied by way of a combiner 726, in some embodiments a negative impedance filter may be applied to raw transducer driving signal x'(t) to generate transducer driving signal x(t) to achieve the same or a similar effect of effectively reducing coil impedance of electromagnetic load 701. An example of such a negative impedance filter is described in U.S. patent application Ser. No. 16/816,790, filed Mar. 12, 2020, and entitled "Methods and Systems for Improving Transducer Dynamics," which is incorporated by reference herein in its entirety.

Transducer driving signal x(t) may in turn be amplified by amplifier 706 to generate a driving signal V(t) for driving electromagnetic load 701. Responsive to driving signal V(t), a sensed terminal voltage $V_T(t)$ of electromagnetic load 701 may be converted to a digital representation by a first analog-to-digital converter (ADC) 703. Similarly, sensed current I(t) may be converted to a digital representation by a second ADC 704. Current I(t) may be sensed across a shunt resistor 702 having resistance $R_s$ coupled to a terminal of electromagnetic load 701. The terminal voltage $V_T(t)$ may be sensed by a terminal voltage sensing block 707, for example a volt meter.

As shown in FIG. 7, system 700 may include an impedance estimator 714. Impedance estimator 714 may include any suitable system, device, or apparatus configured to estimate, based on sensed terminal voltage $V_T(t)$, sensed current I(t), and/or any other measured parameters of electromagnetic load 701, one or more components of the electrical and/or mechanical impedances of electromagnetic load 701, and generate one or more control signals. For example, one control signal generated by impedance estimator 714 may include a negative impedance Re_neg generated based on an estimate of DC coil impedance Re of electromagnetic load 701. As another example, impedance estimator 714 may also generate a voltage offset $V_{OFFSET}$ and a current offset $I_{OFFSET}$, which may be subtracted from sensed terminal voltage $V_T(t)$ and sensed current I(t), respectively, by combiners 710 and 712, respectively, to cancel any measurement offsets that may be present and detected by impedance estimator 714. As a further example, and as described in greater detail below, impedance estimator 714 may generate one or more control signals for communication to haptic state machine 716.

Also shown in FIG. 7 are two bandpass filters (BPF) 730 and 732, respectively, filtering the offset-cancelled versions of the sensed terminal voltage $V_T(t)$ and sensed current I(t). Bandpass filters 730 and 732 may filter out haptic playback content of driving signal V(t) from entering impedance estimator 714, and thus possibly biasing it away from an accurate estimate of DC coil impedance Re. It may be desirable, in some situations, to bypass use of these bandpass filters 730 and 732, for example, in situations where there is no haptic playback. Such a moment may occur when a low latency initial Re estimate must be made just prior to playback of the haptic waveform, as described below with reference to FIG. 9 in initial state 904. Because bandpass filters 730 and 732 may add latency to input signals for impedance estimator 714, it may be desirable to bypass bandpass filters 730 and 732.

Examples of approaches for estimating one or more components of the electrical and/or mechanical impedances of electromagnetic load 701 and generating a negative coil impedance value Re_neg are described in, without limitation, U.S. patent application Ser. No. 16/816,790 filed Mar. 12, 2020 and entitled "Methods and Systems for Improving Transducer Dynamics;" U.S. patent application Ser. No. 16/816,833 filed Mar. 12, 2020 and entitled "Methods and Systems for Estimating Transducer Parameters;" U.S. patent application Ser. No. 16/842,482 filed Apr. 7, 2020 and entitled "Thermal Model of Transducer for Thermal Protection and Resistance Estimation;" and U.S. patent application Ser. No. 16/369,556 filed Mar. 29, 2019 and entitled "Driver Circuitry;" all of which are incorporated by reference herein in their entireties.

As mentioned above and described in greater detail below, a system 700 may effectively reduce a coil impedance of electromagnetic load 701 by applying a negative resistance correction term to raw transducer driving signal x'(t) to generate transducer driving signal x(t), which may reduce an effective quality factor q of the transducer, which may in turn decrease attack time and minimize ringing occurring after the raw transducer driving signal has ended. Quality factor q of a transducer may be expressed as:

$$q = \frac{R_{RES} * Re}{R_{RES} + Re} * \sqrt{\frac{C_{MES}}{L_{CES}}} \tag{7}$$

In equation (7), as DC resistance Re increases, the numerator term $R_{RES}*Re$ increases more rapidly than the denominator term $R_{RES}+Re$. Therefore, quality factor q generally increases with increasing DC resistance Re. Accordingly, one way system 700 may minimize quality factor q is to effectively decrease DC resistance Re. In some embodiments, system 700 may ideally decrease the effective DC resistance Re to a point in which critical damping occurs in electromagnetic load 701.

Figure 8:
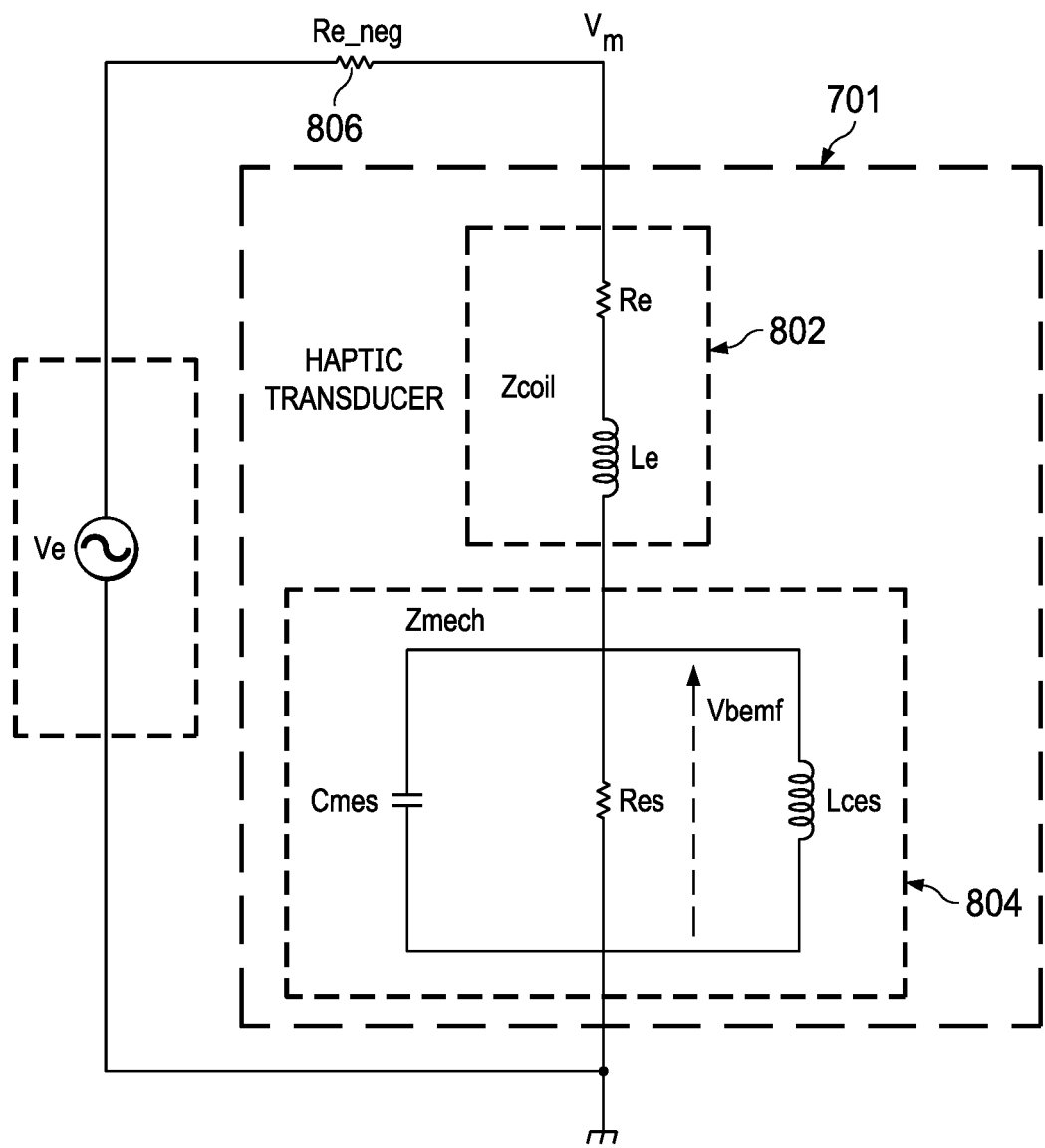
FIG. 8 illustrates an example of a linear resonant actuator (LRA) modelled as a linear system and including a negative resistance, in accordance with embodiments of the present disclosure.

Turning briefly to FIG. 8, FIG. 8 illustrates an example of electromagnetic load 701 modelled as a linear system including electrical components 802 and electrical model of mechanical components 804 and including a negative resistance resistor 806 with negative impedance Re_neg inserted in series with electromagnetic load 701, in accordance with embodiments of the present disclosure. The addition of negative impedance Re_neg may lower quality factor q because effectively it subtracts from DC resistance Re thereby reducing the overall DC electrical impedance.

In practice, negative resistors do not exist. Instead, system 700 may be configured to behave substantially like the circuit shown in FIG. 8, including a mathematical model of negative impedance Re_neg in series with a mathematical model of electromagnetic load 701. In operation, system 700

(e.g., at the output of combiner 726) may in effect compute a voltage $V_m$ that would occur at the junction of negative impedance Re_neg and DC resistance Re as shown in FIG. 8, if, in fact, it were possible to place a physical resistor with negative impedance Re_neg in series with electromagnetic load 701. Computed voltage $V_m$ may then be used to drive electromagnetic load 701.

In essence, system 700 may implement a sensorless velocity control feedback loop for electromagnetic load 701. The feedback loop may use a dynamic estimate of parameters of electromagnetic load 701 and generate feedback (e.g., negative impedance Re_neg) to cancel most of the electrical and mechanical impedance of electromagnetic load 701. In the case of DC coil resistance Re, its estimate must be quite accurate (e.g., <1% error) in order for the feedback loop of system 700 to achieve stability and achieve the desired negative impedance effect. The electrical and mechanical impedance of electromagnetic load 701 may change in response to the stimulus applied to it (e.g., amplitude and frequency of driving signal V(t)), ambient temperature conditions, and/or other factors.

Turning back to FIG. 7, system 700 may also comprise a pilot tone generator 718. Pilot tone generator 718 may comprise any system, device, or apparatus configured to, responsive to one or more control signals received from haptic state machine 716, generate a pilot tone significantly below or above a resonance frequency of electromagnetic load 701. Accordingly, pilot tone generator 718 may be capable of driving signals at frequencies and amplitudes that may affect electrical parameters of electromagnetic load 701, while producing little or no perceptible haptic effects at electromagnetic load 701. As shown in FIG. 7, the output of pilot tone generator 718 may be combined by combiner 724 with the output of haptic waveform generator 722.

Haptic state machine 716 may comprise any system, device, or apparatus configured to, responsive to haptic trigger events, control signals, and/or other information received from other components of system 700, generate control signals to other components of system 700 to control operation of such other components in order to sequence pilot tone generation of pilot tone generator 718, haptic waveforms generated by haptic waveform generator 722, and operation of impedance estimator in order to accurately and efficiently (from a time latency perspective) estimate coil resistance of electromagnetic load 701.

To better understand the functionality of haptic state machine 716, it may be illustrative to consider various possible conditions for system 700 and electromagnetic load 701. For example, possible conditions for electromagnetic load 701 may include:
- a haptic trigger has been received by system 700 but electromagnetic load 701 is not yet stimulated to produce haptic vibration;
- a haptic playback event is ongoing at electromagnetic load 701 and electromagnetic load 701 is stimulated;
- a haptic playback event just ended and electromagnetic load 701 is no longer stimulated by the driving signal, but electromagnetic load 701 may be in motion; or
- a haptic playback event has not occurred for a significant period of time and electromagnetic load 701 has experienced no motion since the end of the prior haptic event.

Possible conditions for a haptic playback waveform generated by haptic waveform generator 722 may include:
- the haptic playback waveform is pre-stored in a memory;
- the haptic playback waveform is dynamically generated as it is played back;
- the haptic playback waveform has spectral content concentrated in the frequency region near and including the resonant frequency of electromagnetic load 701;
- the haptic playback waveform has significant spectral content in the frequency region below the resonant frequency of electromagnetic load 701;
- the haptic playback waveform has significant spectral content in the frequency region above the resonant frequency of electromagnetic load 701; and
- the haptic playback waveform has significant spectral content in the frequency regions at, below, and above the resonant frequency of electromagnetic load 701.

Possible conditions for pilot tones generated by pilot tone generator 718 may include:
- the pilot tone is at a frequency significantly below the resonant frequency of electromagnetic load 701 such that impedance of electromagnetic load is dominated by DC coil resistance Re;
- the low-frequency pilot tone may be played during a haptic playback event;
- the low-frequency pilot tone may be played for some minimum amount of time during and after a haptic playback event such that sufficient cycles of the pilot tone have occurred to provide a first estimate of DC coil resistance Re for frequencies below the resonant frequency of electromagnetic load 701;
- the low-frequency pilot tone may be played when a pre-determined period of time (e.g., one minute) has occurred since the end of a previous haptic playback event;
- the pilot tone is at a frequency significantly above the resonant frequency of electromagnetic load 701 such that impedance of electromagnetic load 701 is dominated by DC coil resistance Re and coil inductance Le;
- the high-frequency pilot tone may be briefly played immediately after a haptic trigger but immediately before the playback of the haptic playback waveform (e.g., a short enough period of time such that a user perceives no delay between the haptic trigger and the haptic effect responsive to the haptic trigger);
- the high-frequency pilot tone may be played for some minimum amount of time during and after a haptic playback event such that sufficient cycles of the pilot tone have occurred to provide a first estimate of DC coil resistance Re for frequencies above the resonant frequency of electromagnetic load 701; and
- the pilot tone is a combination of the low-frequency and high-frequency tones described above played for some minimum amount of time during and after the haptic playback event such that sufficient cycles of the tones provide first estimates of DC coil resistance Re at a frequency significantly above the resonant frequency of electromagnetic load 701, coil resistance Re at a frequency significantly below the resonant frequency of electromagnetic load 701, and coil inductance Le.

In all cases, the pilot tones may be at amplitudes low enough that a user is unable to perceive the presence of the pilot tones, either through tactile perception or auditory perception.

To better understand the functionality of haptic state machine 716, it may also be illustrative to consider various possible approaches for estimating various entities of system 700 and electromagnetic load 701. For example, possible estimation approaches for determining DC coil resistance Re and coil inductance Le of electromagnetic load 701 may include:

a least-squares fitting technique to determine a relationship between voltage and current as seen by electromagnetic load 701; and a thermal model to predict change in DC coil resistance Re over time, which may:
  use a timer to track elapsed time between significant events, such as a start of a haptic playback event, end of a haptic playback event, and time between haptic events;
  be used to predict how much electromagnetic load 701 heats up during a haptic playback event;
  be used to predict how much electromagnetic load 701 cools down after a prior haptic playback event; and
  be used to distinguish between changes to DC coil resistance Re due to heating and cooling and ambient temperature.

As another example, possible estimation approaches for determining voltage offset $V_{OFFSET}$ and current offset $I_{OFFSET}$ may include:
  playback of a zero-value haptic playback signal in order to estimate DC offsets of sensed terminal voltage $V_T(t)$ and sensed current I(t); and
  playback of some integer number of cycles of a pilot tone to estimate DC offsets of sensed terminal voltage $V_T(t)$ and sensed current I(t) (e.g., the coil impedances Re and Le may be estimated together with the DC offsets by a least-squares fit procedure; such method may provide a low-latency approach to obtain fresh estimates of the sensor offset and coil impedance between the time of the haptic trigger and the start of haptic playback);
  wherein, in either case, the sampled values resulting from such signals may be, respectively, accumulated and the offsets determined by dividing by the number of samples.

As a further example, a thermal model may be used to determine a relationship between voltage and current as seen by electromagnetic load 701.

Figure 9:
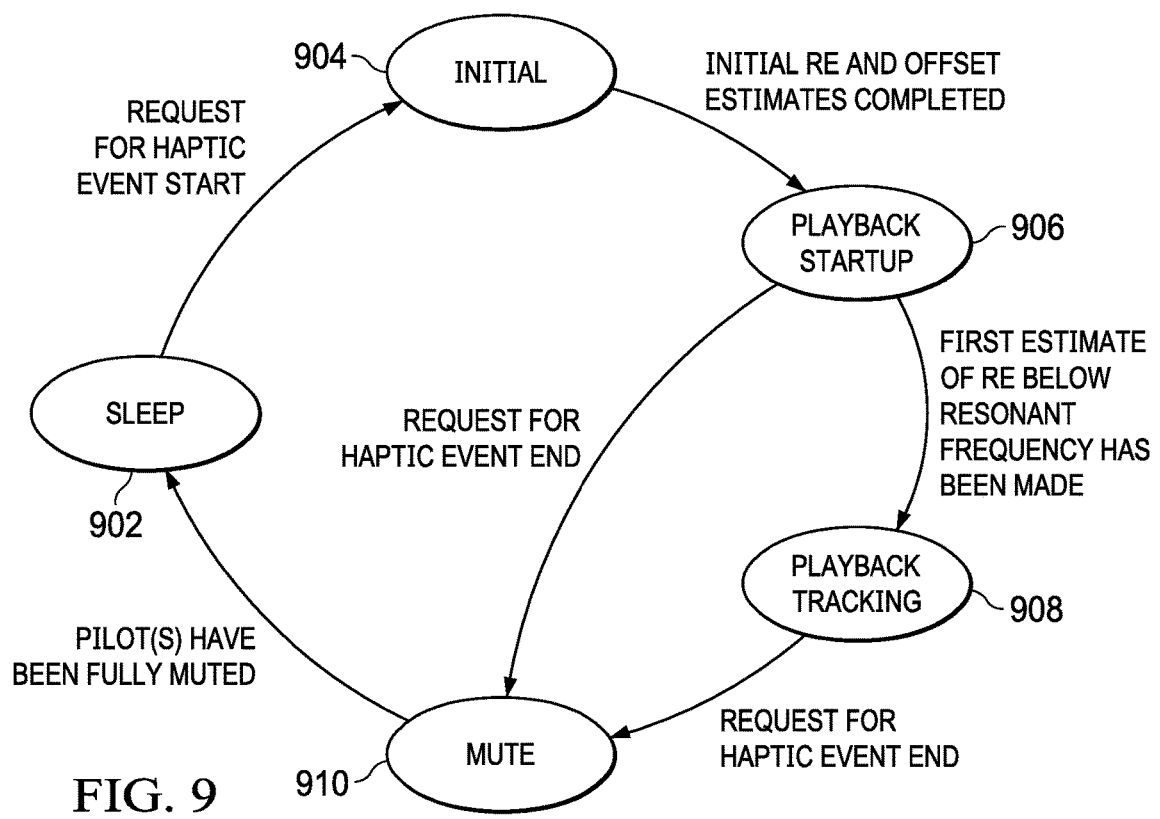
FIG. 9 illustrates a flow chart for example operation of a haptic state machine, in accordance with embodiments of the present disclosure.

FIG. 9 illustrates a flow chart for example operation of haptic state machine 716 without use of a thermal model for coil impedance estimation, in accordance with embodiments of the present disclosure. Upon powering up of system 700, haptic state machine 716 may begin in sleep state 902. Haptic state machine 716 may remain in sleep state 902 until a request for a haptic playback event is received (e.g., a haptic trigger), at which point haptic state machine 716 may proceed to initial state 904.

At initial state 904, haptic state machine 716 may cause pilot tone generator 718 to play a pilot tone significantly above the resonant frequency of electromagnetic load 701 for an integer number of cycles while impedance estimator 714 collects samples of sensed terminal voltage $V_T(t)$ and sensed current I(t). After the end of the integer number of cycles, impedance estimator 714 may estimate voltage offset $V_{OFFSET}$ and current offset $I_{OFFSET}$ to apply during the upcoming haptic playback event, and also estimate DC coil resistance Re for frequencies above the resonant frequency of electromagnetic load 701. Once impedance estimator 714 has completed estimates for voltage offset $V_{OFFSET}$, current offset $I_{OFFSET}$, and DC coil resistance Re, haptic state machine 716 may proceed to playback startup state 906.

During playback startup state 906, haptic state machine 716 may cause haptic waveform generator 722 to play the haptic playback waveform responsive to the haptic trigger received during sleep state 902, and may also cause pilot tone generator 718 to play a pilot tone significantly below the resonant frequency of electromagnetic load 701 contemporaneously with the haptic playback waveform. In some embodiments, haptic state machine 716 may cause pilot tone generator 718 to play a pilot tone significantly above the resonant frequency of electromagnetic load 701 contemporaneously with the haptic playback waveform. Also during playback startup state 906, haptic state machine 716 may cause impedance estimator 714 to collect samples of sensed terminal voltage $V_T(t)$ and sensed current I(t), now compensated by voltage offset $V_{OFFSET}$ and current offset $I_{OFFSET}$, respectively, and estimate DC coil resistance Re for frequencies below the resonant frequency of electromagnetic load 701. In embodiments in which haptic state machine 716 causes pilot tone generator 718 to play a pilot tone significantly above the resonant frequency of electromagnetic load 701 contemporaneously with the haptic playback waveform during playback startup state 906, impedance estimator 714 may also estimate DC coil resistance Re for frequencies below the resonant frequency of electromagnetic load 701 and/or estimate coil inductance Le. If and when a first estimate of DC coil resistance Re for frequencies below the resonant frequency of electromagnetic load 701 is made, haptic state machine 716 may proceed to playback tracking state 908. On the other hand, if and when a request has been made for the haptic playback event to end (e.g., at the end of the haptic playback waveform generated by haptic waveform generator 722 responsive to the haptic trigger), haptic state machine 716 may proceed to mute state 910.

As specific examples, the resonant frequency of electromagnetic load 701 may be 150 Hz in haptic applications. A pilot tone significantly below such resonant frequency may be a tone of between 10 Hz and 40 Hz. A pilot tone significantly above such resonant frequency may be a tone of between 500 Hz and 2.5 KHz. Because a human ear may be most sensitive to tones in the 2-KHz range, a tone around such frequency may cause a perceptible acoustic response. To mitigate this possibility, the pilot tone significantly above resonant frequency may be set to very low signal magnitudes (e.g., 100 mV) and played back for a very short duration (e.g., 5 milliseconds) between a haptic trigger and a playback of a haptic waveform such that any residual audio transient is masked by an onset of the haptic playback itself.

In the case that electromagnetic load 701 does not have an audible response in the region of the pilot tone above the resonant frequency, it may be advantageous to play both a pilot tone below the resonant frequency and a pilot above the resonant frequency at the same time along with transducer driving signal x(t), for a number of reasons. The higher-frequency pilot may enable an estimate for DC coil resistance Re earlier in time as compared to when the lower-frequency pilot may be able to provide an estimate for DC coil resistance Re. In that case, system 700 may begin tracking changes to DC coil resistance Re sooner. As the lower-frequency pilot reaches a time at which a more accurate estimate of DC coil resistance Re is achieved with the lower-frequency pilot rather than the higher-frequency pilot, impedance estimator 714 may switch its output negative impedance Re_neg accordingly. A tradeoff may exist between length of estimate and accuracy—the high-frequency pilot may enable a reasonably accurate estimate sooner, but the lower frequency pilot enables a more accurate estimate for longer term tracking of changes to DC coil resistance Re. Because accuracy of estimate DC coil resistance Re (e.g., less than 1% error may be required for feedback loop stability, as described above) may be critical for the feedback control loop to be stable and provide value, playing the two pilot tones together may be advantageous. Finally, the estimate of the lower-frequency pilot estimate may be able to provide a calibration reference value for the higher-frequency pilot, because the lower-frequency pilot may enable the more accurate estimate. It is known that DC coil resistance Re may increase with frequency due to eddy current losses in the magnet of electromagnetic load 701, thus the coil impedance estimate with the high-frequency pilot tone may be higher than the actual DC coil resistance Re needed for the feedback control loop. Having the two estimates from the high- and low-frequency pilots simultaneously may allow the estimate from the high-frequency pilot tone to be calibrated to match the estimate from the low-frequency pilot tone in order to infer an unbiased DC coil resistance Re from the estimate based on the high-frequency pilot tone. Depending on construction of electromagnetic load 701, the difference between estimates of the low-frequency pilot tone and high-frequency pilot tone may be negligible or may amount to several percent.

During playback tracking state 908, haptic state machine 716 may cause pilot tone generator 718 to continue playing the pilot tone(s) generated during playback startup state 906, may cause impedance estimator 714 to continue to collect samples of sensed terminal voltage $V_T(t)$ and sensed current I(t) as compensated by voltage offset $V_{OFFSET}$ and current offset $I_{OFFSET}$, respectively, and continue to estimate DC coil resistance Re for frequencies below the resonant frequency of electromagnetic load 701. In embodiments in which haptic state machine 716 causes pilot tone generator 718 to play a pilot tone significantly above the resonant frequency of electromagnetic load 701 contemporaneously with the haptic playback waveform during playback startup state 906 (and playback tracking state 908), impedance estimator 714 may also continue to estimate DC coil resistance Re for frequencies below the resonant frequency of electromagnetic load 701 and/or estimate coil inductance Le. If and when a request has been made for the haptic playback event to end (e.g., at the end of the haptic playback waveform generated by haptic waveform generator 722 responsive to the haptic trigger), haptic state machine 716 may proceed to mute state 910.

In mute state 910, haptic state machine 716 may cause haptic waveform generator 722 to cease playing the haptic playback waveform, cause pilot tone generator 718 to ramp down (or step down) the magnitude(s) of any pilot tone(s) it is generating, cause impedance estimator 714 to cease collection of samples of sensed terminal voltage $V_T(t)$ and sensed current I(t) and generation of impedance estimates. This ramp down function may be important because simply stepping down the pilot tone may result in a broadband transient that triggers a human-perceptible acceleration response, and the ramp down function may reduce or eliminate such transient artifact. During mute state 910, haptic state machine 716 may cause impedance estimator 714 to save (e.g., to a memory accessible to impedance estimator 714) all final estimated impedance values and any other estimated values during the haptic playback event. After pilot tone generator 718 has muted the pilot tone(s), haptic state machine 716 may proceed again to sleep state 902.

Figure 10:
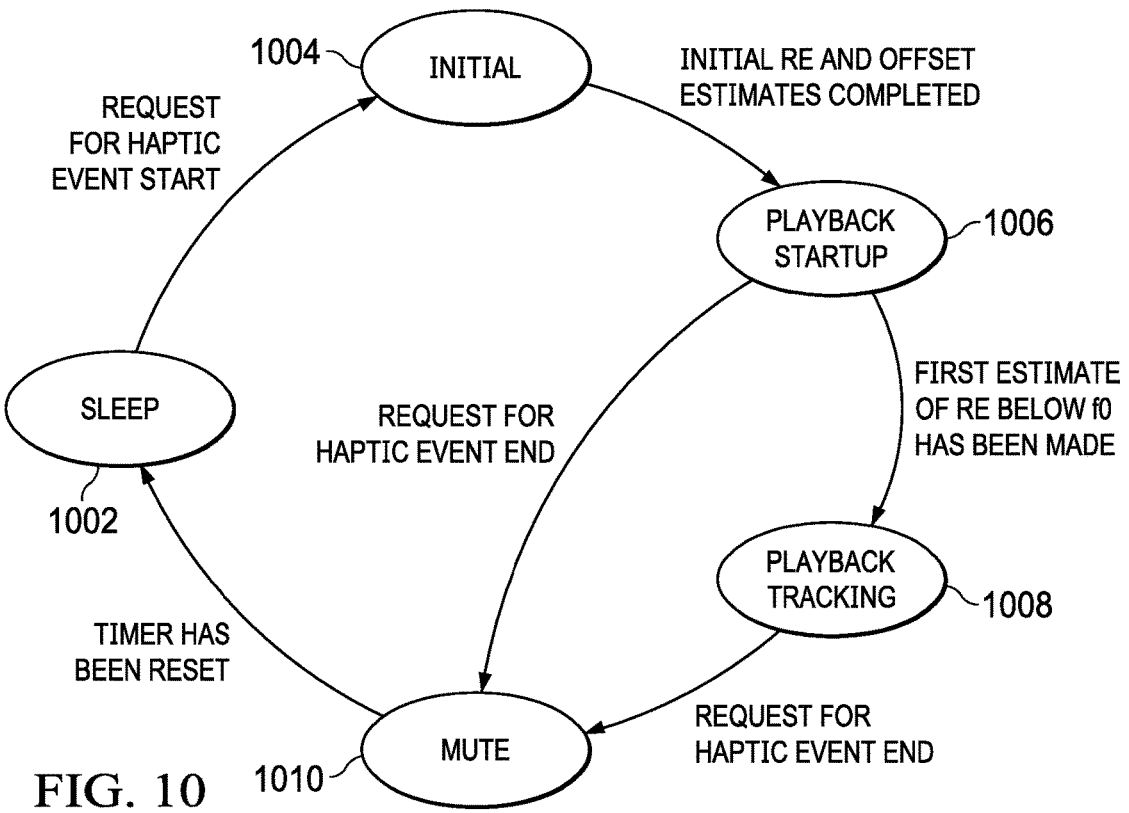
FIG. 10 illustrates a flow chart for example operation of a haptic state machine when using a thermal model for coil impedance estimation, in accordance with embodiments of the present disclosure.

FIG. 10 illustrates a flow chart for example operation of a haptic state machine when using a thermal model for impedance estimation, in accordance with embodiments of the present disclosure.

Upon powering up of system 700, haptic state machine 716 may begin in sleep state 1002. Haptic state machine 716 may remain in sleep state 1002 until a request for a haptic playback event is received (e.g., a haptic trigger), at which point haptic state machine 716 may proceed to initial state 1004. At initial state 1004, haptic state machine 716 may cause haptic waveform generator 722 to playback a zero waveform for a pre-determined period of time, during which impedance estimator 714 may collect samples of sensed terminal voltage $V_T(t)$ and sensed current I(t). After the end of the predetermined period of time, impedance estimator 714 may estimate voltage offset $V_{OFFSET}$ and current offset $I_{OFFSET}$ to apply during the upcoming haptic playback event. Also during initial state 1004, haptic state machine 716 may cause impedance estimator 714 to use a thermal model (e.g., as described in U.S. patent application Ser. No. 16/842,482 filed Apr. 7, 2020 and entitled "Thermal Model of Transducer for Thermal Protection and Resistance Estimation," referenced above), to estimate an initial value of DC coil resistance Re based on a prior haptic playback event's estimated DC coil resistance Re, ambient temperature, and elapsed time since the prior haptic playback event. Once impedance estimator 714 has completed estimates for voltage offset $V_{OFFSET}$, current offset $I_{OFFSET}$, and DC coil resistance Re, haptic state machine 716 may proceed to playback startup state 1006.

During playback startup state 1006, haptic state machine 716 may cause haptic waveform generator 722 to play the haptic playback waveform responsive to the haptic trigger received during sleep state 1002, and may also cause pilot tone generator 718 to play a pilot tone significantly below the resonant frequency of electromagnetic load 701 contemporaneously with the haptic playback waveform. Also during playback startup state 1006, haptic state machine 716 may cause impedance estimator 714 to collect samples of sensed terminal voltage $V_T(t)$ and sensed current I(t), now compensated by voltage offset $V_{OFFSET}$ and current offset $I_{OFFSET}$, respectively, and estimate DC coil resistance Re for frequencies below the resonant frequency of electromagnetic load 701. Further in playback startup state 1006, impedance estimator 714 may update its thermal model. If and when a first estimate of DC coil resistance Re for frequencies below the resonant frequency of electromagnetic load 701 is made, haptic state machine 716 may proceed to playback tracking state 1008. On the other hand, if and when a request has been made for the haptic playback event to end (e.g., at the end of the haptic playback waveform generated by haptic waveform generator 722 responsive to the haptic trigger), haptic state machine 716 may proceed to mute state 1010.

During playback tracking state 1008, haptic state machine 716 may cause pilot tone generator 718 to continue playing the pilot tone generated during playback startup state 1006, and may cause impedance estimator 714 to continue to collect samples of sensed terminal voltage $V_T(t)$ and sensed current I(t) as compensated by voltage offset $V_{OFFSET}$ and current offset $I_{OFFSET}$, respectively, continue to estimate DC coil resistance Re for frequencies below the resonant frequency of electromagnetic load 701, and continue to update the thermal model of impedance estimator 714. If and when a request has been made for the haptic playback event to end (e.g., at the end of the haptic playback waveform generated by haptic waveform generator 722 responsive to the haptic trigger), haptic state machine 716 may proceed to mute state 1010.

In mute state 1010, haptic state machine 716 may cause haptic waveform generator 722 to cease playing the haptic playback waveform, cause pilot tone generator 718 to ramp down (or step down) the magnitude of any pilot tone it is generating, and cause impedance estimator 714 to cease collection of samples of sensed terminal voltage $V_T(t)$ and sensed current I(t), generation of impedance estimates, and updating of the thermal model. During mute state 1010, haptic state machine 716 may cause impedance estimator 714 to save (e.g., to a memory accessible to impedance estimator 714) all final estimated impedance values and any other estimated values during the haptic playback event. Further, in mute state 1010, haptic state machine 716 may cause impedance estimator 714 to reset a timer. After the timer has been reset, haptic state machine 716 may proceed again to sleep state 1002. Notably, during sleep state 1002, the timer may continue to run so that it may be used to estimate DC coil resistance (e.g., via a thermal model) when haptic state machine 716 again enters the initial state 1004.

Figure 11:
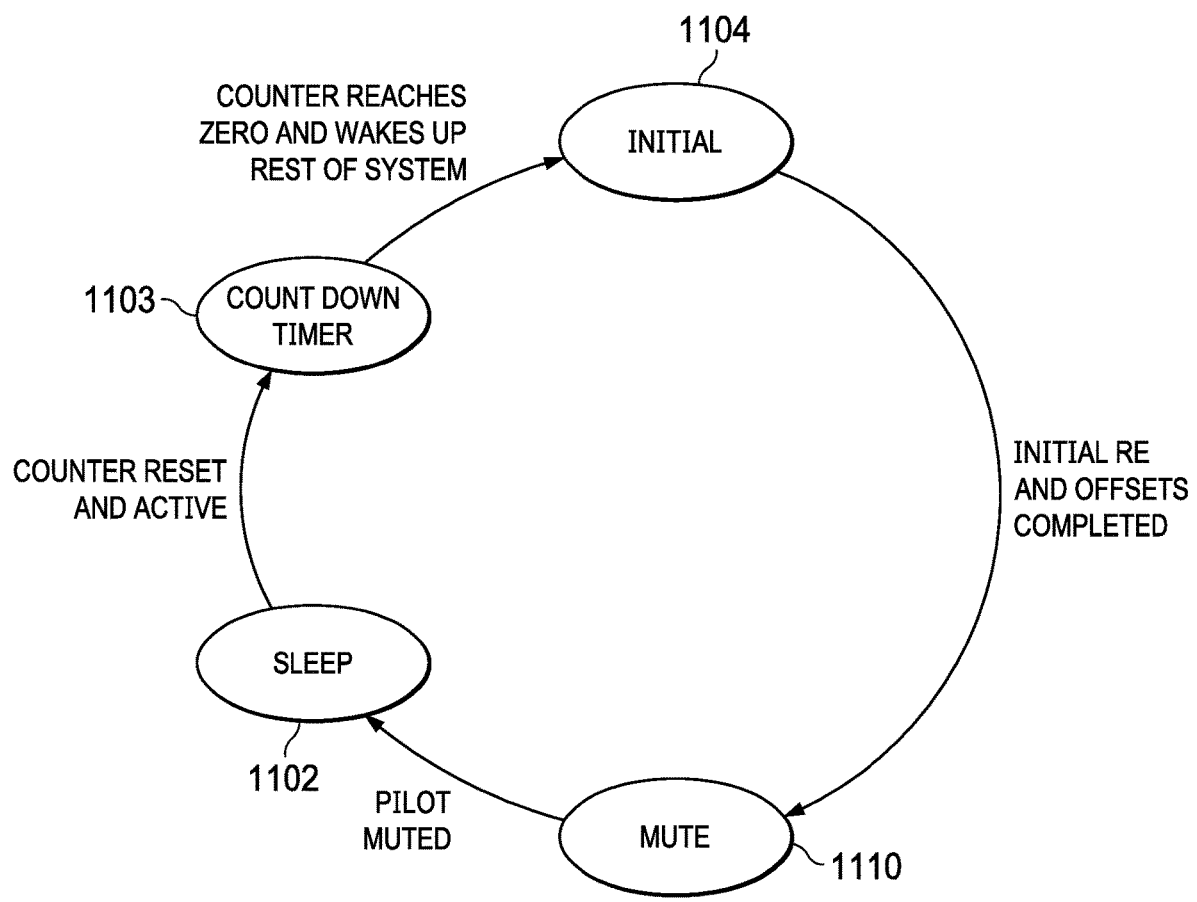
FIG. 11 illustrates a flow chart for example operation of a haptic state machine when using background calibration for coil impedance estimation, in accordance with embodiments of the present disclosure.

FIG. 11 illustrates a flow chart for example operation of haptic state machine 716 when used in a background calibration mode for coil impedance estimation, in accordance with embodiments of the present disclosure. If it has been a significant time since a prior haptic event, haptic state machine 716 may begin in sleep state 1102. Upon entering sleep state 1102, a counter may become active and may be reset to some positive predetermined value, for example, a value which corresponds to 60 seconds. A countdown may then begin (count down timer 1103), for example, once per second, and proceeds toward zero if no haptic events are requested during such period of time. If a haptic event happens to occur before expiration of the timer, then haptic state machine 716 may proceed according to either of FIG. 9 or FIG. 10. If, however, a haptic event does not occur before expiration of the counter, haptic state machine 716 may proceed to initial state 1104.

At initial state 1104, haptic state machine 716 may cause pilot tone generator 718 to play a pilot tone significantly below the resonant frequency of electromagnetic load 701 for one complete cycle of the pilot tone while impedance estimator 714 collects samples of sensed terminal voltage $V_T(t)$ and sensed current $I(t)$. After the end of the pilot tone, impedance estimator 714 may estimate voltage offset $V_{OFFSET}$ and current offset $I_{OFFSET}$ to apply during the next haptic playback event, the next time it occurs, and also estimate DC coil resistance Re for frequencies below the resonant frequency of electromagnetic load 701. Once impedance estimator 714 has completed estimates for voltage offset $V_{OFFSET}$, current offset $I_{OFFSET}$, and DC coil resistance Re, haptic state machine 716 may proceed to mute state 1110.

In mute state 1110, haptic state machine 716 may cause pilot tone generator 718 to ramp down (or step down) the magnitude of the pilot tone it is generating, and cause impedance estimator 714 to cease collection of samples of sensed terminal voltage $V_T(t)$ and sensed current $I(t)$, and generation of impedance estimates. During mute state 1110, haptic state machine 716 may cause impedance estimator 714 to save (e.g., to a memory accessible to impedance estimator 714) all final estimated impedance values and any other estimated values during the haptic playback event. Haptic state machine 716 may proceed again to sleep state 1102. Notably, during sleep state 1102, the countdown timer may be reset.

FIG. 12 provides a summary of different example methods for estimating coil impedance, all of which may be managed by haptic state machine 716, shown in its various modes in FIGS. 9, 10, and 11. For example, highlighted in FIG. 12 are three different methods used to achieve an initial estimate of DC coil resistance Re prior to playback of a haptic waveform. These three methods may form the basis, respectively, for which mode haptic state machine 716 operates in, wherein FIGS. 9, 10, and 11, each represent a mode. It may be desirable to calculate an initial estimate of DC coil resistance Re as close in time to a haptic event request as possible, and without human-perceptible delay between the request for the haptic event and the haptic effect. A haptic event, for example, may be in response to a virtual-button push with an acknowledgement (e.g., a short click or vibration) by the device back to the user that the virtual button was actually pushed. Approaches to achieve an initial estimate of DC coil resistance Re without perceptible delay are set forth in the first three rows of the table in FIG. 12. In two of these three approaches ("Thermal Model" and "Background Calibration"), an initial estimate of DC coil resistance Re may be based on a recent past estimate. In one approach ("High Frequency Pilot"), the initial estimate of DC coil resistance Re may be formed after a request for a haptic event is made, but the high-frequency pilot approach may estimate Re very quickly (for example, in under 5 milliseconds) so that there is little or no human-perceptible delay between the event request and the perceived effect itself. Achieving a low-latency estimate of DC coil resistance Re may become increasingly important in devices which may employ force-sensing virtual buttons, which have their own latency between the user interaction with the virtual button and the device hosting the virtual button actually detecting such user interaction. The latency of this user interaction detection is typically much longer than the latency of the initial estimate of DC coil resistance Re, using one of the three approaches outlined in FIG. 12. For this reason, it may be important for a satisfying user experience that the initial estimate of DC coil resistance Re be as low latency as possible in order not to add human-perceptible delay between a user interacting with a virtual button and receiving a haptic effect in acknowledgement of such user interaction.

Also highlighted in FIG. 12 are three different approaches to track DC coil resistance Re during playback of haptic waveforms. These three approaches are shown in the last three rows of the table of FIG. 12. In these approaches, some kind of stimulus (e.g., a high-frequency pilot or low-frequency pilot or the haptic waveform itself if sufficiently broadband) may be used to excite electromagnetic load 701 so that an estimation technique, such as least squares, may continuously estimate a relationship between sensed terminal voltage $V_T(t)$ sensed current $I(t)$ in order to estimate accurately the DC coil impedance Re and possibly coil inductance Le.

Which of the approaches set forth in FIG. 12 may be used to achieve an initial estimate of DC coil impedance Re and a continuously-updated estimate of DC coil impedance Re may depend on a response of electromagnetic load 701, especially its acoustic response. A decision regarding choice of approach may be made during haptic product development.

Although the foregoing discusses application to a linear electromagnetic load, it is understood that systems and methods similar or identical to those disclosed may be applied to other linear or non-linear systems.

Further, although the foregoing contemplates use of a negative resistance filter to implement a model of an LRA, in some embodiments a mathematical equivalent to an LRA may be used in lieu of a model.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method comprising:
   selecting, based on whether an electromagnetic load is in a first condition or a second condition, a measurement technique from a plurality of impedance measurement techniques for measuring an impedance of the electromagnetic load, wherein:
   in the first condition, the electromagnetic load has been stimulated to produce haptic vibration in response to a haptic event but prior to motion of the electromagnetic load; and
   in the second condition, the electromagnetic load is in motion in response to the haptic event after stimulation; and
   performing the selected measurement technique to generate an estimate of the impedance of the electromagnetic load.

2. The method of claim 1, further comprising cycling selection of the selected measurement technique among the plurality of impedance measurement techniques based on the electromagnetic load changing between the first condition and the second condition.

3. The method of claim 1, wherein one of the plurality of impedance measurement techniques comprises applying a pilot driving tone to the electromagnetic load, the pilot driving tone having a frequency significantly higher than a resonant frequency of the electromagnetic load.

4. The method of claim 3, further comprising applying the pilot driving tone prior to playback of a human-perceptible effect to the electromagnetic load in order that the estimate of the impedance of the electromagnetic load is available prior to the playback of a human-perceptible effect to the electromagnetic load.

5. The method of claim 4, further comprising applying the pilot driving tone after a triggering event for playback of the human-perceptible effect to the electromagnetic load.

6. The method of claim 3, further comprising ramping the pilot driving tone to zero at the end of playback of the pilot driving tone.

7. The method of claim 1, wherein one of the plurality of impedance measurement techniques comprises a thermal model of the electromagnetic load and an elapsed time since a previous estimate of the impedance of the electromagnetic load.

8. The method of claim 7, wherein the thermal model utilizes the elapsed time since the previous estimate to form a new estimate of the impedance prior to playback of a human-perceptible effect to the electromagnetic load.

9. The method of claim 8, further comprising estimating the impedance of the electromagnetic load prior to playback of a human-perceptible effect to the electromagnetic load and after a triggering event for playback of the human-perceptible effect to the electromagnetic load.

10. The method of claim 1, wherein one of the plurality of impedance measurement techniques comprises a periodic background calibration of the impedance of the electromagnetic load in the absence of playback of a human-perceptible effect to the electromagnetic load for a predetermined period of time.

11. The method of claim 10, further comprising determining the estimate of the impedance of the electromagnetic load from a most-recent periodic background calibration estimate of the impedance of the electromagnetic load preceding a triggering event for playback of the human-perceptible effect to the electromagnetic load.

12. The method of claim 1, wherein one of the plurality of impedance measurement techniques comprises applying a pilot driving tone to the electromagnetic load, the pilot driving tone having a frequency significantly lower than a resonant frequency of the electromagnetic load.

13. The method of claim 12, further comprising applying an integer number of cycles of the pilot driving tone.

14. The method of claim 12, further comprising applying a second pilot driving tone to the electromagnetic load, the second pilot driving tone having a frequency significantly higher than the resonant frequency of the electromagnetic load.

15. The method of claim 14, further comprising using the estimate of the impedance of the electromagnetic load formed from the second pilot driving tone to track changes in impedance of the electromagnetic load, prior to when the estimate of the impedance of the electromagnetic load formed from the pilot driving tone is available.

16. The method of claim 12, further comprising applying the pilot driving tone to the electromagnetic load simultaneously with playback of a human-perceptible effect to the electromagnetic load.

17. The method of claim 16, further comprising applying the pilot driving tone and determining the estimate of the impedance of the electromagnetic load continuously throughout a duration of the playback of the human-perceptible effect to the electromagnetic load.

18. The method of claim 12, further comprising ramping the pilot driving tone to zero at the end of playback of the pilot driving tone.

19. The method of claim 1, wherein the electromagnetic load comprises a haptic transducer.

20. The method of claim 1, wherein one of the plurality of impedance measurement techniques comprises determining that a playback signal for the electromagnetic load includes an adequate amount of broadband content to obtain an estimate of the impedance without the need for additional test stimulus.

21. The method of claim 1, further comprising estimating sensor offsets for sensing a voltage and current associated with the electromagnetic load contemporaneously with performing the selected measurement technique to generate an estimate of the impedance of the electromagnetic load.

22. A system for estimating impedance of an electromagnetic load comprising:
 a haptic state machine configured to select, based on whether an electromagnetic load is in a first condition or a second condition, a measurement technique from a plurality of impedance measurement techniques for measuring an impedance of the electromagnetic load, wherein:
  in the first condition, the electromagnetic load has been stimulated to produce haptic vibration in response to a haptic event but prior to motion of the electromagnetic load; and
  in the second condition, the electromagnetic load is in motion in response to the haptic event after stimulation; and
 an impedance estimator configured to perform the selected measurement technique to generate an estimate of the impedance of the electromagnetic load.

23. The system of claim 22, the haptic state machine further configured to cycle selection of the selected measurement technique among the plurality of impedance measurement techniques based on the electromagnetic load changing between the first condition and the second condition.

24. The system of claim 22, further comprising a pilot tone generator, and wherein one of the plurality of impedance measurement techniques comprises the pilot tone generator applying a pilot driving tone to the electromagnetic load, the pilot driving tone having a frequency significantly higher than a resonant frequency of the electromagnetic load.

25. The system of claim 24, the pilot tone generator further configured to apply the pilot driving tone prior to playback of a human-perceptible effect to the electromagnetic load in order that the estimate of the impedance of the electromagnetic load is available prior to the playback of a human-perceptible effect to the electromagnetic load.

26. The system of claim 25, the pilot tone generator further configured to apply the pilot driving tone after a triggering event for playback of the human-perceptible effect to the electromagnetic load.

27. The system of claim 24, the pilot tone generator further configured to ramp the pilot driving tone to zero at the end of playback of the pilot driving tone.

28. The system of claim 22, wherein one of the plurality of impedance measurement techniques comprises a thermal model of the electromagnetic load and an elapsed time since a previous estimate of the impedance of the electromagnetic load.

29. The system of claim 28, wherein the thermal model utilizes the elapsed time since the previous estimate to form a new estimate of the impedance prior to playback of a human-perceptible effect to the electromagnetic load.

30. The system of claim 29, the impedance estimator further configured to estimate the impedance of the electromagnetic load prior to playback of a human-perceptible effect to the electromagnetic load and after a triggering event for playback of the human-perceptible effect to the electromagnetic load.

31. The system of claim 22, wherein one of the plurality of impedance measurement techniques comprises a periodic background calibration of the impedance of the electromagnetic load in the absence of playback of a human-perceptible effect to the electromagnetic load for a predetermined period of time.

32. The system of claim 31, the impedance estimator further configured to determine the estimate of the impedance of the electromagnetic load from a most-recent periodic background calibration estimate of the impedance of the electromagnetic load preceding a triggering event for playback of the human-perceptible effect to the electromagnetic load.

33. The system of claim 22, wherein one of the plurality of impedance measurement techniques comprises applying a pilot driving tone to the electromagnetic load, the pilot driving tone having a frequency significantly lower than a resonant frequency of the electromagnetic load.

34. The system of claim 33, the pilot tone generator further configured to apply an integer number of cycles of the pilot driving tone.

35. The system of claim 33, the pilot tone generator further configured to apply a second pilot driving tone to the electromagnetic load, the second pilot driving tone having a frequency significantly higher than the resonant frequency of the electromagnetic load.

36. The system of claim 35, the impedance estimator further configured to use the estimate of the impedance of the electromagnetic load formed from the second pilot driving tone to track changes in impedance of the electromagnetic load, prior to when the estimate of the impedance of the electromagnetic load formed from the pilot driving tone is available.

37. The system of claim 33, the pilot tone generator further configured to apply the pilot driving tone to the electromagnetic load simultaneously with playback of a human-perceptible effect to the electromagnetic load.

38. The system of claim 37, the pilot tone generator further configured to apply the pilot driving tone and determine the estimate of the impedance of the electromagnetic load continuously throughout a duration of the playback of the human-perceptible effect to the electromagnetic load.

39. The system of claim 33, the pilot tone generator further configured to ramp the pilot driving tone to zero at the end of playback of the pilot driving tone.

40. The system of claim 22, wherein the electromagnetic load comprises a haptic transducer.

41. The system of claim 22, wherein one of the plurality of impedance measurement techniques comprises determining that a playback signal for the electromagnetic load includes an adequate amount of broadband content to obtain an estimate of the impedance without the need for additional test stimulus.

42. The system of claim 22, the impedance estimator further configured to estimate sensor offsets for sensing a voltage and current associated with the electromagnetic load contemporaneously with performing the selected measurement technique to generate an estimate of the impedance of the electromagnetic load.

43. A host device comprising:

an electromagnetic load; and a subsystem coupled to the electromagnetic load and configured to:

select, based on whether an electromagnetic load is in a first condition or a second condition, a measurement technique from a plurality of impedance measurement techniques for measuring an impedance of the electromagnetic load, wherein:

in the first condition, the electromagnetic load has been stimulated to produce haptic vibration in response to a haptic event but prior to motion of the electromagnetic load; and in the second condition, the electromagnetic load is in motion in response to the haptic event after stimulation; and perform the selected measurement technique to generate an estimate of the impedance of the electromagnetic load.

* * * * *